(12) United States Patent
Lu

(10) Patent No.: US 11,257,564 B1
(45) Date of Patent: Feb. 22, 2022

(54) DEFECT DETECTION FOR A MEMORY DEVICE

(71) Applicant: Micron Technology, inc., Boise, ID (US)

(72) Inventor: Chun Yi Lu, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/089,180

(22) Filed: Nov. 4, 2020

(51) Int. Cl.
*G11C 29/38* (2006.01)
*G11C 29/44* (2006.01)
*G11C 29/02* (2006.01)
*G11C 29/12* (2006.01)
*G11C 29/40* (2006.01)

(52) U.S. Cl.
CPC ............ *G11C 29/38* (2013.01); *G11C 29/025* (2013.01); *G11C 29/12015* (2013.01); *G11C 29/44* (2013.01); *G11C 2029/4002* (2013.01)

(58) Field of Classification Search
CPC .. G11C 29/38; G11C 29/025; G11C 29/12015
See application file for complete search history.

(56) References Cited

U.S. PATENT DOCUMENTS

| 2004/0133830 A1* | 7/2004 | Lee | G11C 29/025 714/724 |
| 2014/0013171 A1* | 1/2014 | Lim | G01R 31/3187 714/724 |
| 2018/0364303 A1* | 12/2018 | Werhane | H03K 5/133 |

* cited by examiner

*Primary Examiner* — Han Yang
(74) *Attorney, Agent, or Firm* — Holland & Hart LLP

(57) ABSTRACT

Methods, systems, and devices for defect detection for a memory device are described. A segmented digital die defect detector may include multiple signal lines, each coupled with a test circuit, and a control circuit to form a path. At least part of the path may extend through an internal portion of the die. A test circuit may generate a digital feedback signal that indicates a condition of a respective signal line. The control circuit may generate a single output signal, indicative of the condition of the signal lines. By utilizing digital testing circuitry and a single digital output signal, a layout area of the segmented digital die defect detector may be reduced and a power consumption associated with the testing operation may be reduced.

24 Claims, 8 Drawing Sheets

DEFECT DETECTION FOR A MEMORY DEVICE

FIELD OF TECHNOLOGY

The following relates generally to defect detection for a memory device and more specifically to determining the condition of the die of the memory device.

BACKGROUND

In the context of integrated circuits, a die is a portion of a wafer (e.g., a silicon wafer) upon which one or more circuits may be fabricated. Memory devices are one example of a type of integrated circuit that may be fabricated upon a die. Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Memory devices and other types of integrated circuits are typically fabricated on semiconductor materials and are created using semiconductor manufacturing processes. During the manufacturing processes, several of the same integrated circuits are formed on wafers of semiconductor materials concurrently, and are then separated into individual semiconductor dies. Each of the dies represents a separate semiconductor device, which may be separately packaged and included in a larger electronic system. Examples of semiconductor devices include memory devices, multiprocessor devices, power semiconductor devices, and many others. Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Such memory devices may be produced as an integrated circuit on a semiconductor die. The semiconductor die may be sliced, cut, or "diced" from a wafer of semiconductor material.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Figure 1:
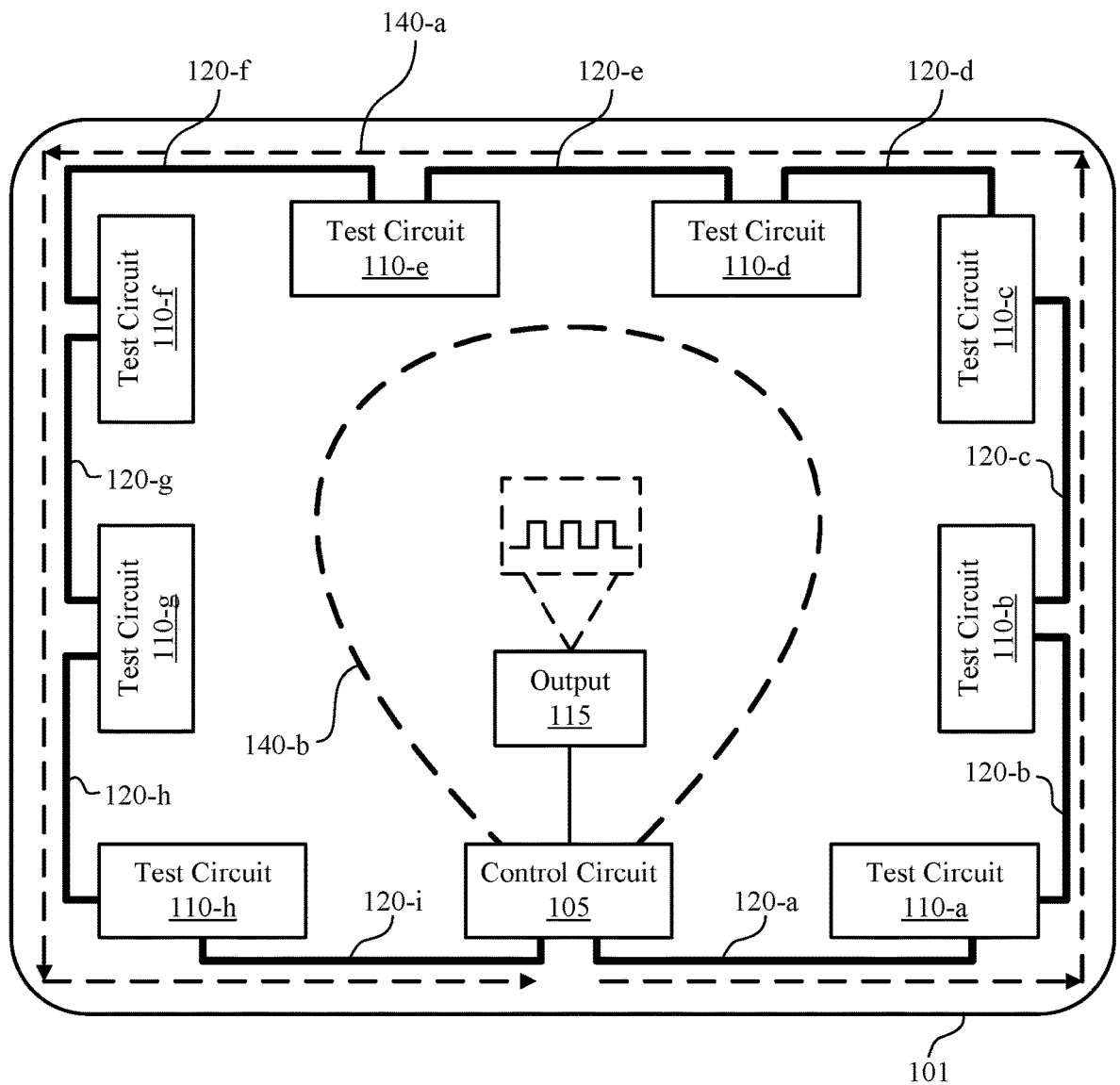
FIG. 1 illustrates an example of a segmented digital die defect detector that supports defect detection for a memory device in accordance with examples as disclosed herein.

Some integrated circuits are fabricated on semiconductor materials and are created using semiconductor manufacturing processes that yield several integrated circuits formed on a single wafer. The wafer may be fabricated (e.g., sliced or otherwise severed) into individual semiconductor dies. Due to the nature of the semiconductor materials, as well as the process that fabricates (e.g., severs from a wafer) multiple dies (e.g., concurrently), the dies may be susceptible to defects, such as cracks. For example, the fabrication process may produce stress on a respective edge of two dies cut from the same wafer. Such stress may lead to a crack in the respective edge of one or both of those dies. Stresses during or after fabrication, may also lead to cracks in the interior of the die, away from the die's edge.

Detecting defects in a die is challenging in some cases because visually inspecting the wafers for cracks in the die may be prohibitively slow and may not be practical for large-scale production. Additionally, defects in the die may not be visually apparent (e.g., may be visually apparent under stress, may be too small, may exist along a line feature and may not be easily detectable). Accordingly, it may be useful for structures and techniques for detecting defects in a die that may be scaled to account for more effective and efficient production of dies.

In some cases, conductive lines or rings (e.g., continuous conductive rings) may be formed on the outer edges of dies to determine whether defects exist in a respective die. However, detecting defects using such conductive lines may use the generation of one or more analog test signals, which is often both a time and power consuming process. Additionally, the components associated with generating analog test signals may use components (e.g., transistors) with large voltage tolerances, which may use a large portion of the die area. Accordingly, digital solutions for detecting defects of a die are desirable. Also, because some conductive lines are formed on the outer edges of the die, those conductive lines may not be able to detect defects in the interior of the die, away from the die's edge. And due to other conductive lines and die components, the rings may not be extended into the interior of the die.

Techniques are described herein for using a segmented digital die defect detector to determine defects (e.g., cracks) in a die (e.g., a memory die). For example, to determine the existence and/or location of a crack in a die, the segmented die defect detector may include a control circuit coupled with multiple test circuits and separate signal lines positioned throughout the die (e.g., around the perimeter of the die and/or through the interior of the die) to form a path that includes portions along the perimeter of the die and through the interior of the die. Each test circuit may include a multiplexer configured to selectively route to the control circuit a feedback signal indicating a condition of one or more signal lines located between the test circuit and the control circuit in the path or couple the one or more signal lines located between the test circuit and the control circuit with one or signal lines further removed from the control circuit in the path.

The feedback signals may be routed to the control circuit, which may generate a single digital output signal that indicates whether a defect is located at or around a particular signal line, or whether the die is free from any cracking. By using a digital testing process, the testing process may take less time, and the die defect detector may consume less power (e.g., as opposed to a testing process using an analog signal). Additionally, by extending the path into the interior of the die, defects in the interior of the die that may have been missed may now be detected. Additionally or alternatively, components associated with the generation of a single digital output signal may consume a smaller portion of the die (e.g., as opposed to a testing process using an analog signal).

Features of the disclosure are initially described in the context of systems, dies, and circuit diagrams as described with reference to FIGS. 1-3. Features of the disclosure are described in the context of systems, and flowcharts as described with reference to FIGS. 3-6. These and other features of the disclosure are further illustrated by and described with reference to an apparatus diagram and flowcharts that relate to defect detection for a memory device as described with reference to FIGS. 7-8.

FIG. 1 illustrates an example of a segmented digital die defect detector 100 that supports defect detection for a memory device in accordance with examples as disclosed herein. Using die defect detector 100, signals may be propagated through a path and analyzed to detect defects in the die.

The segmented digital die defect detector 100 is fabricated on a die 101 of a memory device, on which one or more other circuits may be fabricated including one or more memory cells. In some cases, the die 101 may be a memory die. The segmented digital die defect detector 100 may include a control circuit 105, one or more test circuits 110 (e.g., test circuits 110-*a*, 110-*b*, 110-*c*, 110-*d*, 110-*e*, 110-*f*, 110-*g*, and 110-*h*), and an output 115. In some examples, output 115 may be referred to as an output signal 115. The segmented digital die defect detector 100 may also include one or more signal lines 120 (e.g., signal lines 120-*a*, 120-*b*, 120-*c*, 120-*d*, 120-*e*, 120-*f*, 120-*g*, 120-*h*, and 120-*i*) coupled with the test circuits 110 to form a path 140-*a* starting and ending at control circuit 105 and extending along the perimeter of die 101. Digital die defect detector 100 may also be referred to as a digital die ring. Each of the signal lines 120 may couple a test circuit 110 with a next test circuit 110 in path 140-*a*, or in the case of a test circuit 110 that is next in path 140-*a* to the control circuit 105, may couple a test circuit 110 with the control circuit 105. For example, signal line 120-*a* may couple the control circuit 105 with test circuit 110-*a*, and signal line 120-*b* may couple test circuit 110-*a* with test circuit 110-*b*.

In some examples, the segmented digital die defect detector 100 may include a control circuit 105 that may be coupled with the one or more test circuits 110, directly or indirectly, via the one or more signal lines 120. Control circuit 105 may be configured to generate and transmit to test circuits 110, via path 140-*a*, one or more signals for determining whether a defect (e.g., a crack) exists in the die 101. For example, control circuit 105 may transmit an enable signal and/or a clock signal to one or more test circuits 110 to determine whether a defect exists. An enable signal may be referred to as a digital segment selection signal, for example, and may enable a test circuit 110 upon reaching the test circuit 110. Additionally or alternatively, a clock signal may clock the operation of control circuit 105 and the one or more test circuits 110.

Each of the test circuits 110 may be formed along an edge of die 101, such that defects along the perimeter of die 101 may be detected. By placing multiple test circuits 110 along the outer edges of die 101, defects in the perimeter of die 101 may be more efficiently and more accurately located (e.g., which signal line 120 is associated with the defect may be more precisely determined). By more effectively locating defects in the perimeter of die 101, the cause of the defects may be identified and remedied. For example, the process of detecting defects in die 101 may prevent further defects from being caused in other dies using the same or similar fabrication processes. Accordingly, the layout of segmented digital die defect detector 100 may be utilized to detect defects in the die, for example, generated by a particular manufacturing process of the die (e.g., blade dicing, laser cutting, etching), or by some other irregularity in the die.

The control circuit 105 may be coupled with one or more test circuits 110 via one or more signal lines 120 along a path 140-*a*. The number of test circuits 110 and signal lines 120 may depend on a size of die 101 and/or the accuracy or precision with which a defect is to be detected along a specific portion of die 101. For example, utilizing additional test circuits 110 on die 101, a location of the defect may be detected more accurately or precisely because each signal line 120 may cover a smaller portion of die 101.

By way of example, test circuit 110-*a* may be referred to as a first test circuit 110-*a* and test circuit 110-*b* may be referred to as a second test circuit 110-*b*. Signal line 120-*a* may be referred to as a first signal line 120-*a* and signal line 120-*b* may be referred to as a second signal line 120-*b*. To determine a condition of first signal line 120-*a* and/or second signal line 120-*b*, control circuit 105 may first transmit a clock signal (e.g., a clock cycle) and an enable signal to first test circuit 110-*a*. In some examples, the clock signal and the enable signal may be transmitted in a first direction along path 140-*a* (e.g., in a counterclockwise direction; away from control circuit 105, as indicated by the arrows of path 140-*a*). First test circuit 110-*a* may be configured to generate a feedback signal based on receiving the enable signal, and first test circuit 110-*a* may be configured to transmit the feedback signal back to control circuit 105 in a second direction (e.g., in a clockwise direction, opposite to the first direction; towards the control circuit 105).

To generate the first feedback signal, first test circuit 110-*a* may first isolate first signal line 120-*a* from second signal line 120-*b*. After isolating signal lines 120-*a* and 120-*b*, test circuit 110-*a* may generate a feedback signal indicative of a condition of first signal line 120-*a*, and transmit the feedback signal to control circuit 105 via first signal line 120-*a*. In some examples, the feedback signal may indicate a first state or a second state of first signal line 120-*a*. The first state may, for example, indicate the existence of a defect (e.g., a crack) associated with first signal line 120-*a* and the second state may indicate the absence of a defect associated with first signal line 120-*a*.

In some examples, each of test circuits 110 may include a multiplexer. Each multiplexer may aid in selectively isolating or coupling signal lines coupled with a same test circuit. For example, test circuit 110-*a* may include a multiplexer that, depending upon the state of a selection signal, which may be based on the enable signal, may either couple first signal line 120-*a* with second signal line 120-*b* or route a feedback signal (e.g., a digital feedback signal) to control circuit 105 and thus ultimately to output 115.

The control circuit 105 may receive a feedback signal from first test circuit 110-*a* that indicates a condition of first signal line 120-*a*. The feedback signal may indicate, for example, that a defect exists in die 101 along (e.g., near to) first signal line 120-*a*, or that no defect exists in die 101 along (e.g., near to) first signal line 120-*a*. Control circuit 105 may be coupled with and control the output 115. If a defect exists, output 115 may indicate such by outputting a "low" (e.g., 0V) signal. If a defect does not exist along first signal line 120-*a*, output 115 may indicate such by outputting a "high" (e.g., 1V) signal, and control circuit 105 may transmit an enable signal to second test circuit 110-*b*.

When an enable signal is transmitted to a subsequent signal line 120 in path 140-*a* (e.g., repeated by first test circuit 110-*a* to second signal line 120-*b*), a multiplexer associated with the preceding test circuit 110 in path 140-*a* may couple the subsequent and preceding signal lines 120. For example, to determine whether a defect exists along second signal line 120-*b*, control circuit 105 may transmit an enable signal to first test circuit 110-*a*, and first test circuit 110-*a* may relay the enable signal to second test circuit 110-*b*, and a multiplexer associated with first test circuit 110-*a* may couple first signal line 120-*a* with second signal line 120-*b*.

Accordingly, a multiplexer associated with second test circuit 110-*b* may selectively isolate second signal line 120-*b* from signal line 120-*c* (e.g., a third signal line). Second test circuit 110-*b* may generate a feedback signal associated with a condition of second signal line 120-*b* and transmit the feedback signal back to control circuit 105. The multiplexer associated with first test circuit 110-*a* may route the feedback signal from second signal line 120-*b* to first signal line 120-*a*, and ultimately to control circuit 105. Accordingly, each multiplexer associated with a respective test circuit 110 may selectively isolate a preceding and subsequent signal line 120 in path 140-*a*, and route a feedback signal (e.g., a return feedback signal) from the subsequent signal line 120 to the preceding signal line 120. Thus, control circuit 105 may receive a feedback signal from test circuit 110-*b* that indicates a condition of second signal line 120-*b*.

As discussed above with respect to first signal line 120-*a*, the feedback signal may indicate that a defect exists in die 101 along (e.g., near to) second signal line 120-*b*, or that no defect exists in die 101 along (e.g., near to) second signal line 120-*b*. If a defect exists, output 115 may indicate such by outputting a "low" (e.g., 0V) signal. If a defect does not exist along second signal line 120-*b*, output 115 may indicate such by outputting a "high" (e.g., 1V) signal, and control circuit 105 may transmit an enable signal to an additional test circuit (e.g., to test circuit 110-*c*). Thus, by way of example, after determining whether a defect exists with second signal line 120-*b*, output 115 may output a respective signal level for each signal line. Stated another way, output 115 may output a single signal with a state that changes over time. For example, the signal may toggle between a "low" and a "high" voltage to indicate whether a defect exists in relation to a particular signal line, where a "high" voltage indicates that no defect exists in the signal line. In other examples, a "low" voltage may indicate that no defect exists in the signal line, and a "high" voltage may indicate the existence of a defect in the signal line.

In some examples, the process described above may continue in a sequential order for each test circuit in path 140-*a*. The testing process may continue and a feedback signal associated with each signal line 120 may indicate that no defect exists along the respective signal line 120. In some cases, the testing process may cease once a defect is determined, or may proceed in a different direction around the segmented digital die defect detector 100 until some or all other signal lines 120 have been tested or an additional defect is determined. Once each signal line 120 has been tested, control circuit 105 may cease transmitting enable signals, and the testing process may end. In some examples, the output signal may remain "high," indicating that no defects exist along die 101.

The test operations of test circuits 110 may determine a defect associated with a signal line 120 coupled with the respective test circuit 110. Test circuits 110 may be operated in conjunction with control circuit 105 and output 115 to determine whether defects exist along the edges of die 101. For example, output 115 may generate a single output signal (e.g., a single digital output signal, whose state may vary over time as feedback signals from each test circuit 110 are received by control circuit 105) based on one or more test circuits 110 determining whether a defect exists in associated signal lines 120. Stated another way, a single output may be generated based on control circuit 105 receiving a plurality of feedback signals from a plurality of test circuits 110.

In some examples, the output signal may be a single, digital signal. The components of test circuits 110 and control circuit 105 may be made up of circuitry designed to carry out their respective functions. This may include various circuit elements, for example, conductive lines, transistors, capacitors, inductors, resistors, amplifiers, multiplexers, latches, flip-flops, logic gates, or other active or inactive elements, configured to carry out the functions described herein.

In some examples, the testing process as described above may occur in multiple directions. For example, control circuit 105 may first transmit an enable signal to signal line 120-*a*, and testing may proceed in a counterclockwise direction (e.g., ending with signal line 120-*i*). In other examples, control circuit 105 may first transmit an enable signal to signal line 120-*i*, and testing may proceed in a clockwise direction (e.g., ending with signal line 120-*a*). Additionally or alternatively, control circuit 105 may configure testing to proceed in multiple directions—e.g., in a second direction after determining a defect associated with a respective signal line 120 while testing in a first direction. For example, if control circuit 105 were to determine a defect associated with second signal line 120-*b* while proceeding in a counterclockwise direction, the condition of die 101 associated with signal lines 120-*c*, 120-d, 120-*e*, 120-*f*, 120-*g*, 120-*h*, and 120-*i* may be unknown. However, in some examples, control circuit 105 may transmit an enable signal to signal line 120-*i* and proceed in a clockwise direction to determine the condition of such signal lines 120.

In some examples, the path may extend through at least a portion of the die. For example, one or more signal lines may extend through at least a portion of the die to form an internal path (e.g., path 140-*b*). The internal path may include any number of test circuits or may include none. The internal path may or may not be combined with a perimeter path (e.g., perimeter path 140-*a*). The internal path may be controlled by a same control circuit as the perimeter path (e.g., control circuit 105) or may be controlled by a separate control circuit.

Using die defect detector 100, the existence and location of die defects may be determined, both along the perimeter of a die and through the interior of the die. By using a digital testing process, the testing process may take less time, and the die defect detector may consume less power (e.g., as opposed to a testing process using an analog signal). Additionally, components associated with the generation of a single digital output signal may consume a smaller portion of the die (e.g., as opposed to a testing process using an analog signal).

Figure 2:
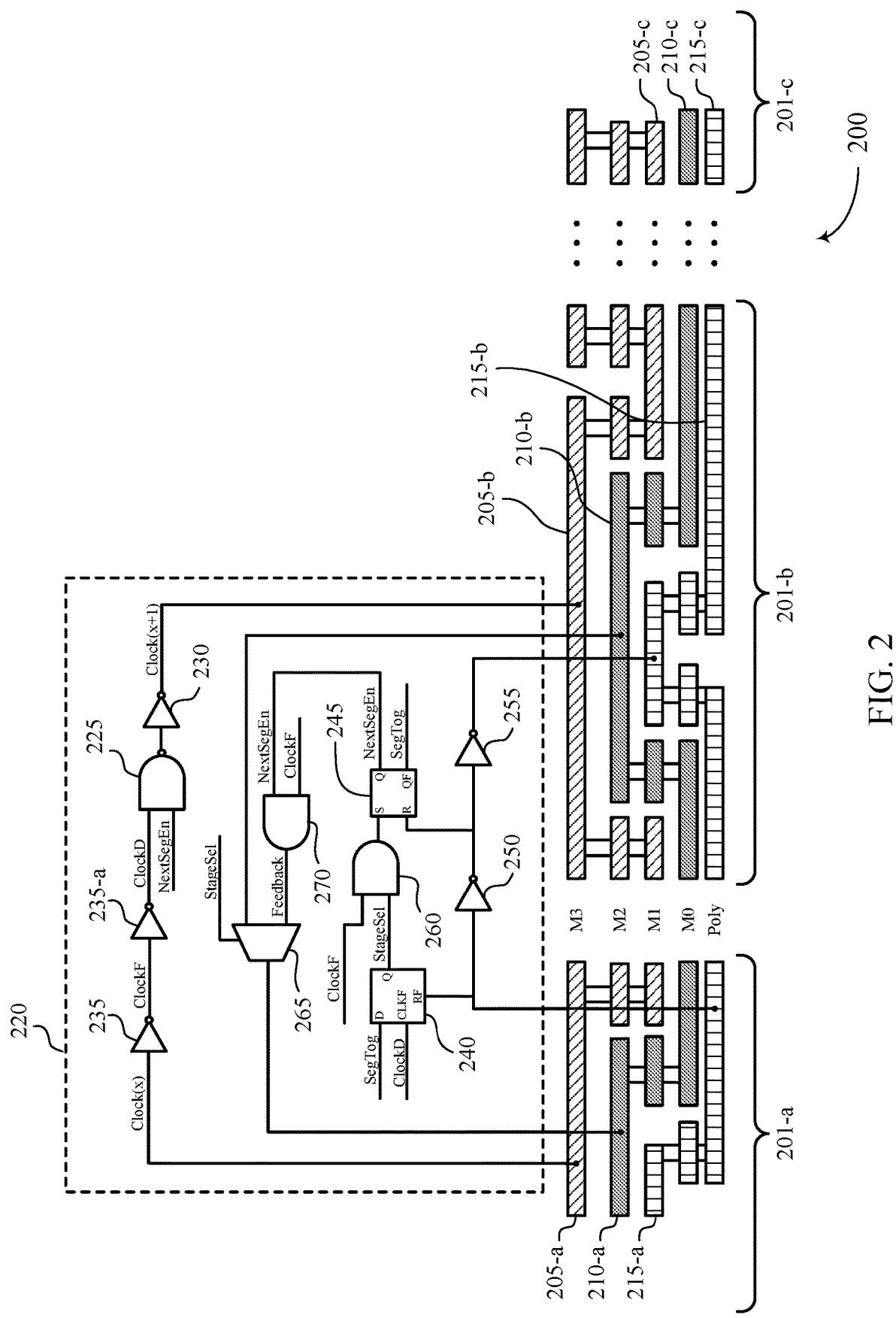
FIG. 2 illustrates an example of a segmented digital die defect detector that supports defect detection for a memory device in accordance with examples as disclosed herein.

FIG. 2 illustrates an example of a segmented digital die defect detector 200 that supports defect detection for a memory device in accordance with examples as disclosed herein.

Segmented digital die defect detector 200 may include multiple signal lines 201 depicted from a cross-sectional view. For example, segmented die defect detector 200 may include signal line 201-a and signal line 201-b, which may be examples of signal lines 120-a and 120-b, respectively, as described with reference to FIG. 1. Each of signal lines 201-a and 201-b may be coupled with a test circuit 220, which may be an example of test circuit 110-a as described with reference to FIG. 1. In some examples, segmented digital die defect detector 200 may include a plurality of signal lines 201 coupled with a plurality of test circuits 220. Thus signal line 201-c may represent a last signal line in a path (e.g., signal line 120-i as described with reference to FIG. 1) of segmented digital die defect detector 200.

In some examples, a die of a memory device may include various signal layers (e.g., a Poly layer and M0, M1, M2, and M3 layers) through which aspects of each signal line 201 may be located. For example, signal line 201-a may include a clock line 205-a that may pass through one or more layers (e.g., layers M1, M2, and M3), a status line 210-a that may pass through one or more layers (e.g., layers M0, M1, and M2), and an enable line 215-a that may pass through one or more layers (e.g., layers Poly, M0, and M1). Each line may be coupled to test circuit 220. Metal or metalization layers may be denoted by M0, M1, M2, and M3. In some cases, layers of insulative material may be positioned between the metal layers.

Test circuit 220 may control test operations associated with signal lines 201-a and 201-b. In the examples described herein, test circuit 220 may correspond to any of the test circuits 110 and the signal lines 201 may correspond to any of the signal lines 120 as described with reference to FIG. 1.

The test circuit 220 may be coupled with signal lines 201-a and 201-b. In some examples, test circuit 220 may couple (e.g., may be configured to selectively couple or decouple) various signal lines (e.g., couple aspects of signal line 201-a with aspects of signal line 201-b). For example, an enable signal may be transmitted to test circuit 220 via enable line 215-a and a feedback signal may be returned to control circuit 105 via status line 210-a. If no defects are associated with signal line 201-a, test circuit 220 may subsequently couple aspects of signal line 201-a with aspects of signal line 201-b and the testing procedures described above may continue (e.g., may progress to include signal line 201-b).

In some examples, clock line 205-a may be coupled with one or more components of test circuit 220. For example, clock line 205-a may be coupled with at least one inverter (e.g., inverter 235) that provides a clock signal (e.g., ClockF) to test circuit 220 based on a Clock(x) signal provided by clock line 205. The logic value of ClockF may be complementary to the logical value of the Clock(x) signal. For example, the Clock(x) signal may be '1V' and the ClockF signal may be '0V'. In some examples, an additional inverter 235-a may generate a delayed clock signal (e.g., ClockD) that may be delayed relative to the Clock(x) signal but have the same logic value.

A NAND gate 225 may be configured to receive the ClockD signal, and an output of NAND gate 225 may be coupled with another inverter 230, which may be coupled with a portion of second signal line 201-b and configured to output a clock signal Clock(x+1) for the second signal line. Clock line 205-a may carry a clock signal that clocks test circuit 220 in operation. Clock line 205-a may be a clock signal Clock(x) that originates from an external system (e.g., tester circuit), or an internal system where that clock signal may be generated (e.g., control circuit 105). For example, the clock line 205-a signal may be generated internally when a test mode of the die is activated. In such a test mode, the clock line 205 signal may be received at test circuit 220 from the internal or external system that generated the clock signal to provide as the clock line 205-a signal.

In some examples, test circuit 220 may include a latch circuit 240, which may be or may be referred to as a D latch circuit 240, and a latch circuit 245, which may be or may be referred to as an SR latch circuit 245. Enable line 215-a may be coupled with latch circuit 240 as well as an inverter 250, and the output of inverter 250 may be coupled with latch circuit 245 as well as an inverter 255. In some examples, latch circuit 240 may be coupled with a portion of signal line 201-a (e.g., the enable line 215-a portion), and the output of inverter 255 may be coupled with a portion of a second (e.g., an additional) signal line 201-b (e.g., the enable line 215-b portion). Enable line 215-a may transmit an enable signal, which may enable testing of a signal line controlled by test circuit 220. The enable signal may be generated when a test mode is activated. For example, the enable signal may be generated at an external system, when a test mode of the die is activated. The enable signal may be received at enable line 215-a from, for example, the external system that generated the signal.

In some examples, latch circuit 240 may receive input, and may output various signals related to controlling a test operation of the die. Latch circuit 240 may receive a SegTog signal, which may be generated by latch circuit 245 as described below and may indicate that test circuit 220 is to include a signal line of the die in a test operation. In some examples, the SegTog signal may be set to a "high" logical level (e.g., set to 1V) prior to a test operation, such that when an edge (e.g., a rising edge) of a clock signal is received at latch circuit 240, the "high" logical level may be latched. For example, latch circuit 240 may receive a ClockD signal, as described above, and an enable signal, which may enable test circuit 220 to test at least one signal line (e.g., signal line 201-a). Latch circuit 240 may output a signal line selection signal, which may also be referred to as a testing stage selection signal (e.g., a StageSel signal) to an AND gate 260, the output of which may be input to second latch circuit 245.

In some examples, latch circuit 240 may also output the StageSel signal to an additional component of test circuit 220, such as a multiplexer 265. Multiplexer 265 may be a two-to-one multiplexer, and the StageSel signal may control which input to multiplexer 265 is output by multiplexer 265 (e.g., which input is routed by multiplexer 265 to preceding signal line 201-a. While described in terms of a D latch circuit, it may be appreciated that any combination of circuitry or latch circuits that receives and sends the signals described herein to control a test operation may be utilized to perform the functionality of latch circuit 240.

In some examples, second latch circuit 245 may receive input based on the enable signal (e.g., an inverted version of the enable signal as output by inverter 250) and the clock signal (e.g., the output of AND gate 260, which may be based on the StageSel signal and the ClockF signal), and output various signals related to controlling a test operation of the die. Latch circuit 245 may output a NextSegEn signal. In some examples, the NextSegEn signal may be received at NAND gate 225 as described above, which may pass a clock signal Clock(x+1) to adjacent signal line 201-*b* or an adjacent test circuit via clock line 205-*b*. Additionally or alternatively, the NextSegEn signal may be received at an AND gate 270, and the output of AND gate 270 may comprise a feedback signal which may indicate a status of preceding signal line 201-*a*. While described in terms of an SR latch circuit, it may be appreciated that any combination of circuitry or latch circuits that receives and sends the signals described herein to control a test operation may be utilized to perform the functionality of latch circuit 245.

Depending on the logic value of StageSel, which may control the operation of multiplexer 265, multiplexer 265 may either route the feedback signal output by AND gate 270 to control circuit 105 via status line 210-*a*, or may couple subsequent signal line 201-*b* with preceding signal line 201-*a*. For example, one input to multiplexer 265 may be coupled with status line 210-*b* of subsequent signal line 201-*b*, and the output of multiplexer 265 may be coupled with status line 210-*a* of preceding signal line 201-*a*. Thus, when StageSel has a first logic value (e.g., a logic "0" value), multiplexer 265 may route the input coupled with status line 210-*b* of subsequent signal line 201-*b* to the output of multiplexer 265.

This may result in subsequent signal line 201-*b* being coupled with preceding signal line 201-*a*. And when StageSel has a second logic value (e.g., a logic "1" value), multiplexer 265 may route the input coupled with the output of AND gate 270 to the output of multiplexer 265. This may result in the feedback signal being routed to control circuit 105 via status line 210-*a* of preceding signal line 201-*a* and the status lines of any additional preceding signal lines.

In some examples, latch circuit 245 may also output a SegTog signal, which may be received at latch circuit 240, as described above. Receiving the SegTog signal at latch circuit 240 may alter a logical state of latch circuit 240. For example, the SegTog signal may be set to a "low" logical level (e.g., 0V) by latch circuit 245, such that when an edge of a clock signal is received at latch circuit 240, the "low" logical level may be latched by latch circuit 240. In some examples, latching the "low" logical level may end a testing operation being conducted by test circuit 220 (e.g., may alter the state of StageSel and thus the state of multiplexer 265), configuring multiplexer 265 to couple subsequent signal line 201-*b* with preceding signal line 201-*a* rather than route the feedback signal generated by AND gate 270. While described in terms of an SR latch circuit 245, it may be appreciated that any combination of circuitry or latch circuits that receives and sends the signals described herein to control a test operation may be utilized to perform the functionality of latch circuit 245.

In some examples, status line 210-*a* may return to control circuit 105 a feedback signal associated with a particular signal line. As described above, status line 210-*a* of previous signal line 201-*a* may be coupled with the output of multiplexer 265, the inputs of which may be coupled with AND gate 270 and with status line 210-*b* of subsequent signal line 201-*b*.

The AND gate 270 may receive a NextSegEn signal from latch circuit 245 and a clock signal ClockF. Based on receiving the NextSegEn signal, AND gate 270 may generate a feedback signal, which multiplexer 265 may route to control circuit 105 when multiplexer 265 is so configured by the StageSel signal. In some cases, the feedback signal may be a "high" (e.g., 1V) value or a "low" (e.g., 0V) value. In some examples, a "high" value may indicate that no defects exist with preceding signal line 201-*a* (or any other additional intervening signal lines 201 between preceding signal line 201-*a* and the control circuit), and a "low" value may indicate that at least one defect exists with preceding signal line 201-*a*. If the feedback signal associated with each intervening signal line 201 was "high," then it may be determined that the defect is isolated to preceding signal line 201-*a*. Upon returning a "high" value to the control circuit, the enable signal may be transmitted to a subsequent test circuit (e.g., via inverter 255, the output of which may be coupled with enable line 215-*b* of subsequent signal line 201-*b*) to determine a condition of a subsequent signal line 201 as described above.

In some examples, the die may not contain any defects. For example, as described with reference to FIG. 1, a clock signal and enable signal may be transmitted to each test circuit 110 along path 140-*a*, and each test circuit may transmit a feedback signal back to control circuit 105 indicating that the condition of the respective signal line is not associated with a defect.

In some examples, clock lines 205 may correspond to a topmost metal layer of the die. The metal layer may be an aluminum layer, for example. Clock lines 205 may represent a conductive path (e.g., a single conductive path) to propagate a signal around the die. Some signal lines of the die may span one or more layers, which may be referred to as vertical segmentation of the die. For example, the die may be vertically segmented according to different signal lines described herein. Accordingly, the signal lines may form conductive paths within the die. In some examples, enable lines 215 may include several layers of the die, which may be or may include metal layers and/or polysilicon layers that form on the substrate of the die. As shown in FIG. 2, while enable line 215-*a* spans three layers, the line may carry additional signals, such as a "reset" signal, which may reset some values at the test circuit 220 coupled to enable line 215-*a*. As shown in FIG. 2, some intermediate connections between the layers of the die may couple the layers to form a single conductive path for signal propagation on enable line 215-*a*. For example, a "reset" signal may be activated at a different layer than the enable signal, but both signals may propagate along the single conductive path. In some examples, a "reset" signal may reset latch circuits 240 and 245 such that a value of the respective latch circuit is reset to a uniform value in each test circuit 220 (e.g., a '0' value).

The test circuit 220 may be configured to generate a feedback signal based at least in part on a condition of a respective signal line 201. The testing of a condition of a respective signal line 201 may include receiving a feedback signal at a control circuit (e.g., control circuit 105 as described with reference to FIG. 1). In some examples, multiple signal lines (e.g., 201-*a*, 201-*b*) may be coupled with each other, which may result in multiple feedback signals being returned to the control circuit. As previously described, an output signal may be generated based on the feedback signal and the clock cycle, which may indicate a condition of one or more signal lines 201. For example, a "high" output signal (e.g., 1V) may indicate that no defects are associated with a respective signal line 201. In other examples, a "low" output signal (e.g., 0V) may indicate that one or more defects are associated with the respective signal line 201.

Thus, test circuit 220 may be configured to receive clock signal 205-a and enable signal 215-a via preceding signal line 201-a. In an initial state of operation (e.g., a first half of a cycle of clock signal 205-a or of a cycle based on clock signal 205-a), test circuit 220 may generate a feedback signal, which may also be referred to as a status signal, and transmit the feedback signal back towards the control circuit via status line 210-a. Test circuit 220 may transmit the feedback signal of preceding signal line 201-a in the opposite direction in which test circuit 220 received clock signal 205-a and enable signal 215-a. In the initial state of operation of test circuit 220, the feedback signal generated and transmitted by test circuit 220 may be based on and thus indicative of a condition of preceding signal line 201-a because, in the event of a defect in preceding signal line 201-a, clock signal 205-a and enable signal 215-a may not reach test circuit 220 (and thus test circuit 220 may not generate the feedback signal) or the feedback signal generated by test circuit 220 may not reach the control circuit 105 via status line 210-a.

If preceding test circuits (that is, test circuits in between test circuit 220 and control circuit 105) generate feedback signals that are successfully received by control circuit 105, and test circuit 220 does not generate a feedback signal that is successfully received by control circuit 105, it may be determined (e.g., by control circuit 105 or by an external device operating segment digital die defect detector 200) that a defect in the die is localized to signal line 201-a. Conversely, if test circuit 220 does generate a feedback signal that is successfully received by control circuit 105, it may be determined (e.g., by control circuit 105 or by an external device operating segment digital die defect detector 200) that signal line 201-a and any preceding signal lines are defect-free.

In a subsequent state of operation (e.g., a second half of a cycle of clock signal 205-a or of a cycle based on clock signal 205-a), test circuit 220 may generate an enable signal NextSegEn for a subsequent test circuit and may generate a clock signal Clock(x+1) for the subsequent test circuit based on the enable signal for the subsequent test circuit. Test circuit 220 may transmit the clock signal Clock(x+1) for the subsequent test circuit and relay the enable signal received via the preceding signal line 201-a (or, alternatively, on the enable signal for the subsequent test circuit) to the subsequent test circuit. Also in the subsequent state of operation, test circuit 220 may couple subsequent signal line 201-b with preceding signal line 201-a via multiplexer 265 (e.g., based on the enable signal NextSegEn for the subsequent test circuit) and route back to control circuit 105 any feedback signal received via subsequent signal line 201-b via status line 210-b).

Using test circuit 220, the existence and location of die defects may be determined, both along the perimeter of a die and through the interior of the die. By using a digital testing process, the testing process may take less time, and the die defect detector may consume less power (e.g., as opposed to a testing process using an analog signal). Additionally, components associated with the generation of a single digital output signal may consume a smaller portion of the die (e.g., as opposed to a testing process using an analog signal).

Figure 3:
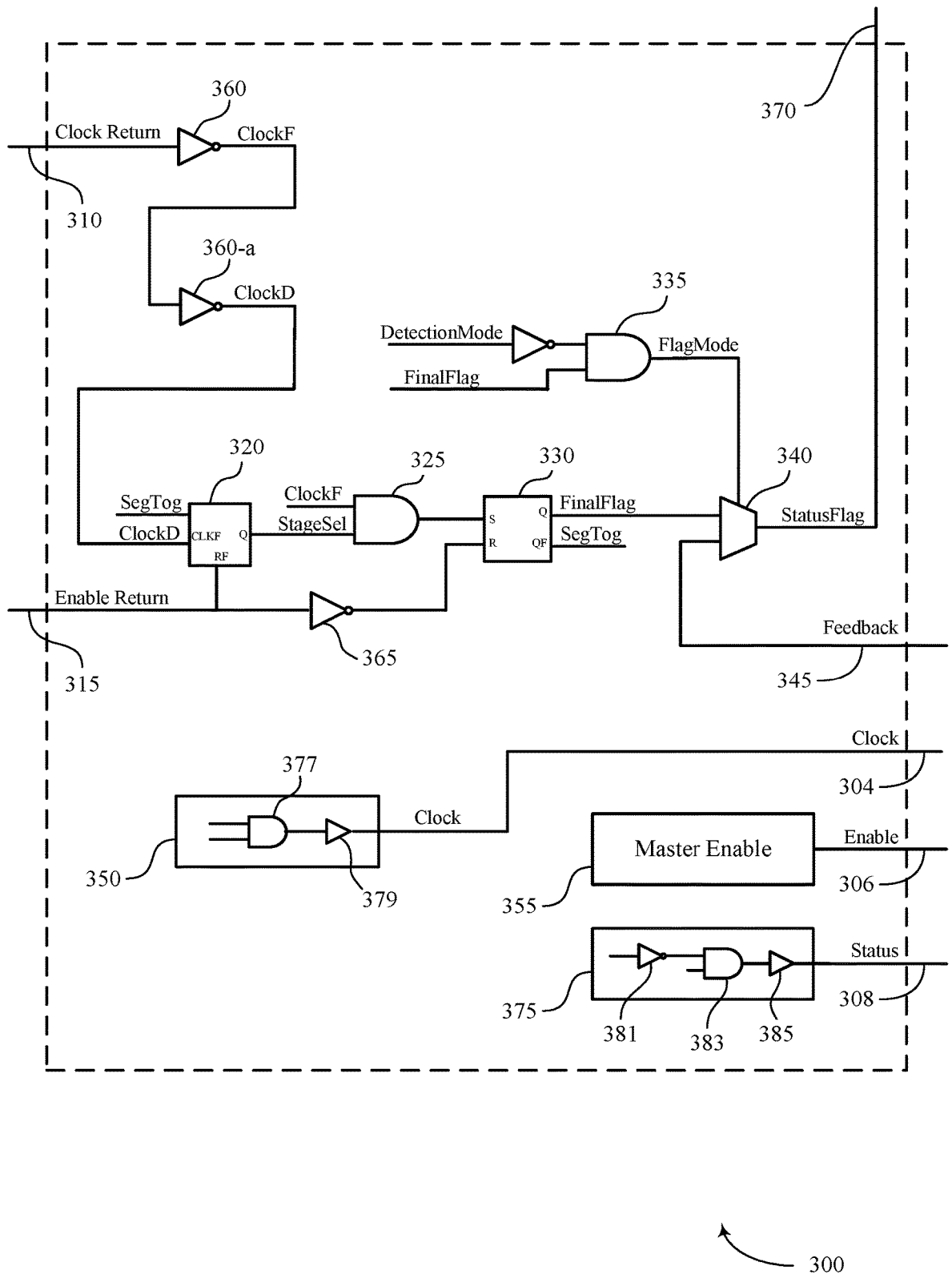
FIG. 3 illustrates an example of a control circuit that supports defect detection for a memory device in accordance with examples as disclosed herein.

FIG. 3 illustrates an example of a control circuit 300 that supports defect detection for a memory device in accordance with examples as disclosed herein. Control circuit 300 may be an example of control circuit 105 as described above with reference to FIG. 1. As described above with reference to FIG. 1, a clock signal, an enable signal, and a status signal may be routed through a path of a die ring (e.g., a segmented digital die defect detector 100 as described with reference to FIG. 1 or a segmented digital die defect detector 200 as described with reference to FIG. 2). In some examples, control circuit 300 may transmit a clock signal to a clock line 304, an enable signal to an enable line 306, and a status signal to a status line 308. Clock line 304, enable line 306, and status line 308 may be associated with a first signal line in a path of a segmented digital die ring (e.g., signal line 120-a as described with reference to FIG. 1). In some examples, control circuit 300 may receive a return clock signal from a return clock line 310 and a return enable signal from a return enable line 315. Return clock line 310 and return enable line 315 may be associated with a last signal line in a path of a segmented digital die ring (e.g., signal line 120-i as described with reference to FIG. 1).

Control circuit 300 may include a master clock component 350, a master enable component 355, and a master status component 375, which may transmit the clock signal, the enable signal, and the status signal, respectively, to the first signal line (e.g., to signal line 120-a as described with reference to FIG. 1).

In some examples, master clock component 350 may include an AND gate 377 coupled with an amplifier 379. The inputs of AND gate 377 may be, for example, a Detection-Mode signal and a master clock signal. At the onset of a test mode, the DetectionMode signal and a master enable signal may be driven to a "high" level to begin the testing operation. Master clock component 350 may output a clock signal.

Master status component 375 may include an inverter 381 coupled with an AND gate 383 and an amplifier 385. In some examples, an input to inverter 381 may be or may include the DetectionMode signal, and inverter 381 may output an inverted DetectionMode signal to one input of AND gate 383. In some examples, a second input of AND gate 383 may be the master clock signal. Master status component 375 may output a status signal.

Receiving the return clock signal and the return enable signal may be based in part on control circuit 300 transmitting the clock signal and the enable signal to the first signal line in the path (e.g., to signal line 120-a). The clock signal and the enable signal may be transmitted, for example, from master clock component 350 and master enable component 355, respectively. As described with reference to FIG. 1, a first test circuit in the path (e.g., test circuit 110-a) may receive the enable signal and may return a feedback signal indicating a condition associated with a respective first signal line (e.g., signal line 120-a). The test circuit may also couple the preceding signal line (e.g., signal line 120-a) with a subsequent signal line (e.g., signal line 120-b) such that the clock signal and the enable signal may be transmitted to a subsequent test circuit in the path (e.g., to test circuit 110-b).

In some examples, this process may continue such that a final signal line in the path (e.g., signal line 120-i) may transmit the clock signal (i.e., the return clock signal) and the enable signal (i.e., the return enable signal) to control circuit 300. As described above, the return clock signal and the return enable signal may be received by return clock line 310 and return enable line 315, respectively. These signals may be received at control circuit 300 (e.g., from signal line 120-i) when no defects (e.g., cracks) exist in the die. For example, if a defect were to exist in the die, a return feedback signal would indicate such, and the testing process (e.g., transmission of the clock signal and the enable signal by control circuit 300) may end.

In some examples, return clock line 310 may be coupled with at least one inverter (e.g., inverter 360) that provides a clock signal ClockF to an AND gate 325. In some examples, the logic value of ClockF may be complementary to the logical value of the received return clock signal. For example, the return clock signal may be '1V' and the ClockF signal may be '0V'. In some examples, an additional inverter (e.g., inverter 360-*a*) may generate a delayed clock signal ClockD that may be delayed relative to the return clock signal but have the same logic value.

In some examples, control circuit 300 may include a latch circuit 320, which may be or may be referred to as a D latch circuit 320, and a latch circuit 330, which may be or may be referred to as an SR latch circuit 330. Return enable line 315 may be coupled with latch circuit 320 as well as an inverter 365, and the output of inverter 365 may be coupled with second latch circuit 330.

In some examples, latch circuit 320 may receive input, and may output various signals related to controlling a test operation of the die. Latch circuit 320 may receive a SegTog signal, which may be output by latch circuit 330. In some examples, the SegTog signal may be set to a "high" logical level (e.g., set to 1V) prior to the return clock signal and return enable signal being received at control circuit 300, such that when an edge (e.g., a rising edge) of a clock signal is received at latch circuit 320, the "high" logical level may be latched. For example, latch circuit 320 may receive a ClockD signal, as described above, and the return enable signal. Latch circuit 320 may output a signal line selection signal, which may also be referred to as a testing stage selection signal (e.g., a StageSel signal) to an AND gate 325, the output of which may be an input to second latch circuit 330. While described in terms of a D latch circuit 320, it may be appreciated that any combination of circuitry or latch circuits that receives and sends the signals described herein to control a test operation may be utilized to perform the functionality of latch circuit 320.

In some examples, second latch circuit 330 may receive input based on the return enable signal and the output of AND gate 325, which may be based on the StageSel signal and the ClockF signal. Second latch circuit 330 may receive an inverted version of the return enable signal output by inverter 365, and may output various signals related to controlling other aspects of control circuit 300. For example, along with the SegTog signal, latch circuit 330 may output a signal to indicate completion of a test sequence for a segmented digital die ring, which may be referred to as a FinalFlag signal, and which may be generated based on control circuit 300 receiving the return clock signal and the return enable signal from a final signal line.

In some examples, the FinalFlag signal may be received at an AND gate 335, along with an inverted version of the DetectionMode signal. As noted above, at the onset of a test operation, the DetectionMode signal may be driven to a "high" level (e.g., to 1V). An inverted version of the DetectionMode signal may be, for example, 0V. Thus, as the FinalFlag signal and an inverted version of the DetectionMode signal may be received at AND gate 335, the output of AND gate 335 may have the same logic value as the FinalFlag signal so long as DetectionMode is high. The output of AND gate 335 may be referred to as a FlagMode signal and may control a multiplexer 340.

Multiplexer 340 may be a two-to-one multiplexer, and the FlagMode signal may control which input to multiplexer 340 is output by multiplexer 340. In some examples, multiplexer 340 may receive an input from latch circuit 330 (e.g., a FinalFlag signal), and a feedback signal 345. The feedback signal 345 may be received from one or more test circuits (e.g., from test circuit 110-*a* as described with reference to FIG. 1, which may also correspond to the output of multiplexer 265 as described with reference to FIG. 2). As described above, each test circuit may receive a clock signal and an enable signal, and may return a feedback signal that indicates a condition of a respective signal line segment. For example, as described with reference to FIG. 1, test circuit 110-*a* may receive a clock signal and an enable signal and may return a feedback signal indicating a condition of signal line 120-*a*. Thus feedback signal 345 may return feedback from multiple test circuits and may toggle between a "high" value (e.g., 1V) and a "low" value (e.g., 0V).

Accordingly, multiplexer 340 may output a StatusFlag signal, reflecting either the FinalFlag signal or the feedback signal 345, depending on the state of the FlagMode signal. Thus, until the FlagMode signal takes on the logic value that selects the FinalFlag signal to output by multiplexer 340, the StatusFlag signal may reflect the feedback signal 345. That is, during a first clock cycle, the state of the StatusFlag signal may reflect the feedback signal generated and transmitted by a first test circuit, then during a second clock cycle, reflect the feedback signal generated and transmitted by a second test circuit, and so on, and thus reflect the condition of associated signal lines.

Once the FlagMode signal takes on the logic value that selects the FinalFlag signal to output by multiplexer 340 (e.g., once signals carried by return clock line 310 and return enable line 315 reach the control circuit 300, and the output of second latch circuit 330 changes logic value), the StatusFlag signal may reflect the FinalFlag signal. Thus, if the StatusFlag signal is configured to have a "high" value (e.g., 1V) once a test sequence is complete, then the StatusFlag signal may be latched into having a high value once the test sequence is complete. Stated another way, return clock line 310 and return enable line 315 may return a return clock signal and a return control signal to control circuit 300 when the respective signals are transmitted around the entire segmented digital die ring (e.g., the die contains no defects). Accordingly, the FinalFlag signal may be generated when the die contains no defects, and may be used in generating the StatusFlag signal. When the die contains no defects, the StatusFlag signal may be output to an output line 370, which may output a "high" value (e.g., 1V) (or, in other examples, a low value) to indicate no defects exist. The StatusFlag signal may correspond to an output signal 115 as discussed in reference to FIG. 1, or an output signal 115 as discussed in reference to FIG. 1 may be based on the StatusFlag signal.

Thus, control circuit 300 may be configured to transmit to a first test circuit via a first signal line and in a first direction, an original clock signal (e.g., a clock signal generated by master clock component 350) and an original enable signal (e.g., a enable signal generated by master enable component 355) and to receive in a second, different direction via (at least in part) the first signal line, a feedback signal (e.g., feedback signal 345), where the feedback signal may be based at least in part on a condition of one or more signal lines traversed by the feedback signal (e.g., based on a condition of a first signal line during a first cycle of the clock signal, then based on a condition of the first signal line and a second signal line during a second cycle of the clock signal, then based on a condition of the first signal line and the second signal line and a third signal line during a third cycle of the clock signal, and so on). Control circuit 300 may be configured to generate or drive (e.g., modify the state of) an output signal 115 based on the feedback signal (e.g., feedback signal 345).

Control circuit 300 may also be configured to receive a return clock signal and a return enable signal via return clock line 310 and return enable line 315 respectively, once the original clock signal and the original enable signal, or at least signals based thereon, have traversed the entirety of the path of a segmented digital die ring. Control circuit 300 may be configured to then alter (e.g., modify the state of) the output signal 115 to reflect a successful completion of a test sequence (e.g., to reflect the value of a FinalFlag signal).

Using control circuit 300, the existence and location of die defects may be determined, both along the perimeter of a die and through the interior of the die. By using a digital testing process, the testing process may take less time, and the die defect detector may consume less power (e.g., as opposed to a testing process using an analog signal). Additionally, components associated with the generation of a single digital output signal may consume a smaller portion of the die (e.g., as opposed to a testing process using an analog signal).

FIG. 1 illustrates an example of a segmented digital die defect detector 400 that supports defect detection for a memory device in accordance with examples as disclosed herein. Similar to the die defect detectors discussed above, using die defect detector 400, signals may be routed through a path and analyzed to detect defects in the die.

Die defect detector 400 is fabricated on a die 401 of a memory device, on which one or more other circuits may be fabricated, including one or more memory cells or one or more banks of memory cells. In some cases, die 401 may be an example of a memory die. For example, die 401 may include one or more memory cells grouped into one or more memory banks 430 (e.g., memory banks 430-a, 430-b, . . . 430-p). Die defect detector 400 may be similar to digital die defect detector 100 (discussed with reference to FIG. 1) in many respects. For example, as with digital die defect detector 100, die defect detector 400 may include a control circuit 405 and one or more test circuits 410 (e.g., test circuits 410-a, 410-b, . . . 410-f) with one or more signal lines 420 (e.g., signal lines 420-a, 420-b, . . . 420-g) coupling one test circuit to the next (or a test circuit to the control circuit) to form a path from control circuit 405, through test circuits 410, and back to control circuit 405.

In some examples, control circuit 405 may correspond to or incorporate aspects of control circuit 105 or control circuit 300 as described with reference to FIGS. 1 and 3; test circuits 410 may correspond to or incorporate aspects of test circuits 110 or test circuit 220 as described with reference to FIGS. 1 and 2; and signal lines 420 may correspond to or incorporate aspects of signal lines 120 or 201 as described with reference to FIGS. 1 and 2.

Also similar to digital die defect detector 100, one or more of the signal lines 420 (e.g., signal lines 420-b, 420-c, . . . 420-f) may be formed along or adjacent to the edge or perimeter 402 of the die 401, so that defects along the perimeter of die 401 may be detected. In this context, the term "adjacent" may refer to components that are near one another. In some cases, adjacent components may be coupled together (electrically or physically) or adjacent components may not be coupled together (electrically or physically). In some examples, a signal line that is adjacent to the edge of a die may be positioned between one or more banks of memory cells and the edge of the die. As discussed above, by placing multiple test circuits and their associated line segments along the outer edges of the die, defects in the perimeter of the die may be more efficiently and more accurately located. But this placement of the test circuits and line segments may detect or identify defects along the outer edges of the die. It may not detect or identify defects internal to the die (e.g., away from the edge or perimeter of the die).

So in digital die defect detector 100, a subset (e.g., one or more) of the signal lines 420 (e.g., signal lines 420-a and 420-g) along the path may extend into the die (as viewed from above) or through a portion of the die (e.g., away from the edge or perimeter 402) so that at least a portion of the path passes through the interior of the die. To differentiate the signal lines that extend into the die from the ones that extend adjacent to the perimeter of the die, the signal lines may be referred to herein as internal signal lines (e.g., signal lines 420-a and 420-g) and perimeter signal lines (e.g., signal lines 420-b, 420-c, . . . 420-f), respectively. In some cases, internal signal lines may be examples of portions of signal lines that extend between banks of memory cells or above banks of memory cells and away from the edge of the die.

As with digital die defect detector 100, clock, enable, and status signals may be initiated by control circuit 405 and be routed along the path from one test circuit to the next via signal lines 420, and the feedback signal may be returned to control circuit 405, as discussed with reference to FIGS. 1-3. With die defect detector 400, the signals may pass through an internal portion of the die (e.g., signals may pass through internal signal line 420-a), but the concept may be the same: the signal lines may extend between adjacent test circuits in the path, or between a control circuit and a first or last test circuit in the path, whether the lines extend along the perimeter or into the internal portion of the die. By doing this, defects internal to the die may be detected or determined in a same manner as defects along a perimeter of the die.

In some examples, a test circuit may be positioned at the intersection of an internal signal line and an external signal line, e.g., so that an internal signal line and a perimeter signal line are coupled thereto. This may help in differentiating the location of a detected defect (e.g., whether a defect is located on an internal portion or a perimeter of the die). For example, test circuit 410-a may be positioned so that internal signal line 420-a and perimeter signal line 420-b are coupled thereto and test circuit 410-f may be positioned so that internal signal line 420-g and perimeter signal line 420-f are coupled thereto.

The internal signal lines may pass through an internal portion of the die in many different manners. For example, when viewed from above, a signal line may pass through in a substantially straight line. In some examples, the signal line may include multiple segments that extend in different directions. In some examples, the signal line may form a geometric shape. In some examples, a signal line may enter and exit the internal portion of the die from a same side of the die (as depicted) or from opposite sides of the die. In some examples, an internal signal line may go in-between components, as viewed from above.

Figure 4:
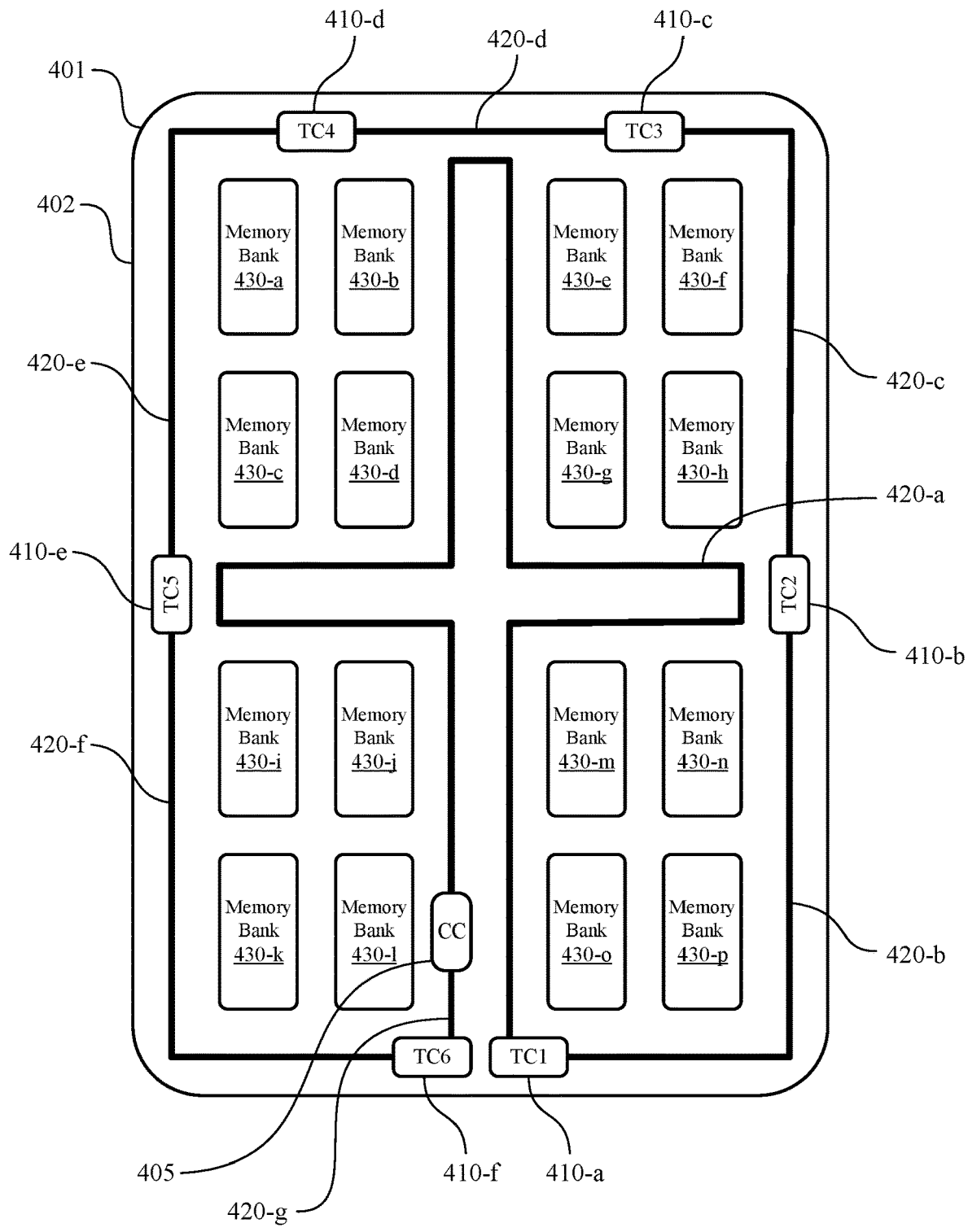
FIG. 4 illustrates an example of a segmented digital die defect detector that supports defect detection for a memory device in accordance with examples as disclosed herein.

In some cases, the internal signal lines may extend through a portion of the die (as viewed from above) that separates one or more circuit elements, e.g., memory banks. For example, as shown in FIG. 4, signal line 420-a may extend through a portion of die 401 that separates memory bank 430-j from memory bank 430-m. In some examples, the internal signal lines may separate the die into multiple regions. For example, as shown in FIG. 4, signal line 420-a may separate die 401 into four separate regions, each including four memory banks 430.

In one example, the placement and/or design of the signal lines may help mitigate potential collisions with other signal lines and/or components that may also be positioned within the internal portion of the die. Dies that include memory cells and supporting circuitry may be quite small and routing layers may include many signals lines used to operate the memory cells. In some portions of the die, it may be difficult to route signal lines that detect defects in an internal portion of the die without displacing or interfering with other signals. In some cases, the die may include a redistribution layer positioned above other layers of the die. In some examples, the redistribution layer may be an example of an iRDL layer that may be used for routing signaling lines, including the internal signal lines used for detecting defects. An iRDL layer may refer to a redistribution layer formed in the semiconductor process before the assembly process to include low resistivity lines to provide power and other signals to locations within the device. The iRDL layer may be provided in an uppermost layer of the die (e.g., over layer M3 of FIG. 2), and may be the lowest resistivity layer in the device. Vias may couple the iRDL layer with the other layers of the die (e.g., layers Poly, M0, M1, M2, and M3). Die defect detector 400 may use one or more signal lines positioned in a layer that passes through the internal portion of the die.

In some examples, there may be a gap in the perimeter of a die where one or more signal lines pass into the internal portion of the die. For example, a gap may exist between test circuit 410-*a* and test circuit 410-*f*, which are coupled respectively with internal signal lines 420-*a* and 420-*g*. To avoid possibly missing defects in the gapped portion of the perimeter, the test circuits 410-*a* and 410-*f* may be positioned physically close together. For example, test circuits 410-*a* and 410-*f* may be brought closer together at the perimeter of the die.

Although FIG. 4 shows two internal signal lines 420-*a* and 420-*g*, any number of internal signal lines may be used. For example, one, three, or more internal signal lines may be used. Furthermore, although the internal signal lines 420-*a* and 420-*g* are completely within the internal portion of die 401, a signal line may alternatively include a portion that passes along the perimeter of the die and a second portion that passes through the interior portion of the die, as discussed in more detail, below.

In some examples, a test circuit may be used to handle more than one signal line. For example, test circuit 410-*b*, and test circuit 410-*e* may be configured to handle two signal lines each and internal signal line 420-*a* may be divided into three segments that pass through the internal portion of the die. A first segment may pass internally between control circuit 405 and test circuit 410-*e*; a second segment may pass internally between test circuit 410-*e* and 410-*b*; and a third segment may pass internally between test circuit 410-*b* and test circuit 410-*a*. In some examples, the internal signal lines 420-*a* and 420-*g* may be coupled with the test circuits 410-*b*, 410-*c*, 410-*d*, or 410-*e*, or any other test circuits in the circuit, or any combination thereof.

Figure 5:
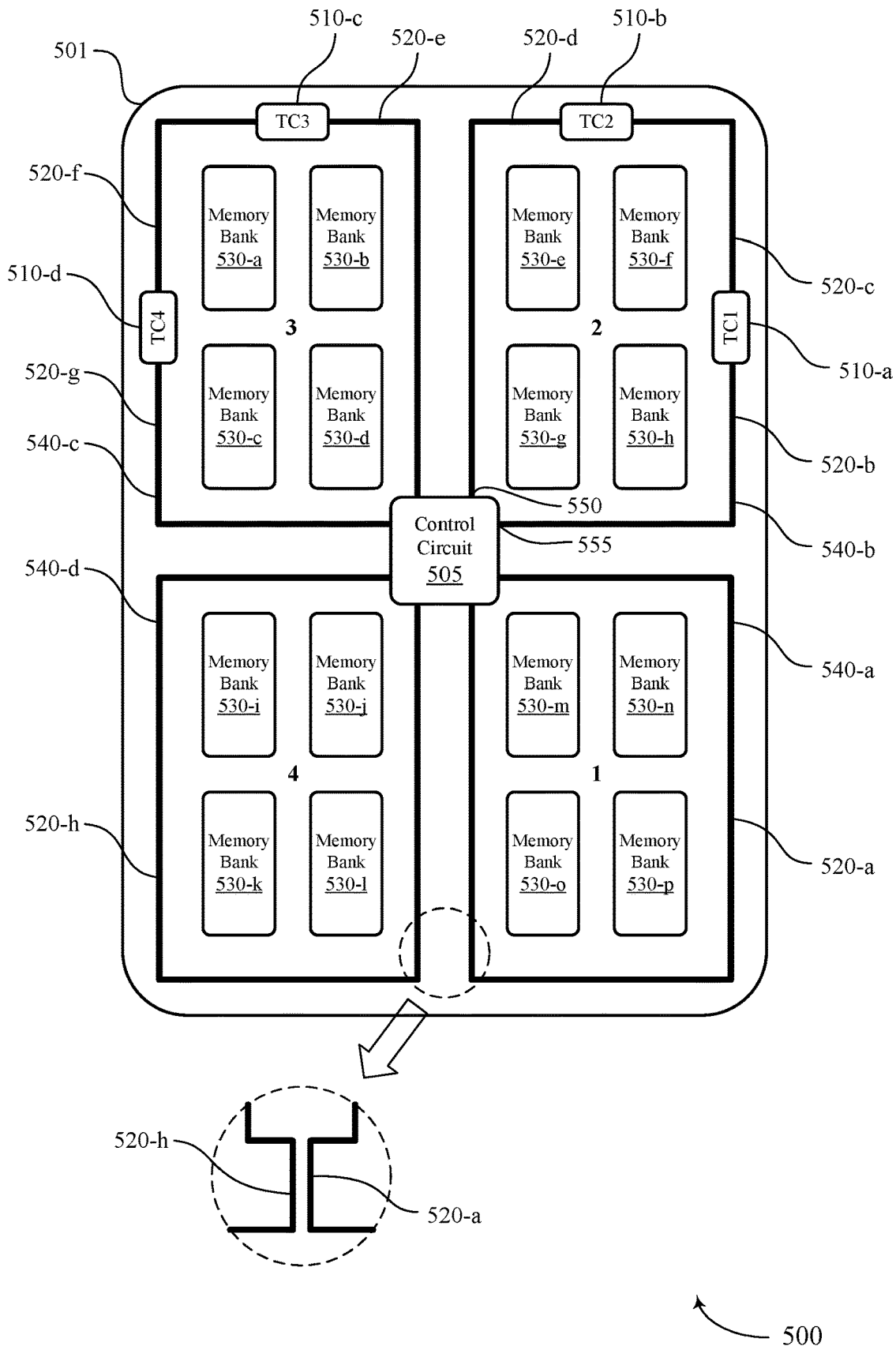
FIG. 5 illustrates an example of a digital die defect detector that supports defect detection for a memory device in accordance with examples as disclosed herein.

FIG. 5 illustrates another example of a digital die defect detector 500 that supports defect detection for a memory device in accordance with examples as disclosed herein. Similar to the die defect detectors discussed above, using die defect detector 500, signals may be routed through a path and analyzed to detect defects in the die Die defect detector 500 is fabricated on a die 501 of a memory device, on which one or more other circuits may be fabricated, including one or more memory cells. In some cases, die 501 may be a memory die. For example, die 501 may include one or more memory cells grouped into one or more memory banks 530 (e.g., memory banks 530-*a*, 530-*b*, . . . 530-*p*). Die defect detector 500 may be similar to die defect detector 400 (discussed with reference to FIG. 4) in many respects. For example, as with die defect detector 400, die defect detector 500 may include a control circuit 505 and one or more test circuits 510 (e.g., test circuits 510-*a*, 510-*b*, . . . 510-*f*) with one or more signal lines 520 (e.g., signal lines 520-*a*, 520-*b*, . . . 520-*g*) coupling the test circuits and the control circuit to form a path from control circuit 505, through test circuits 510, and back to control circuit 505, at least part of the path passing through the internal portion of the die.

But instead of just a single path, die defect detector 500 may include multiple paths through which control circuit 505 may route signals. And one or more of the paths may not include any test circuits. For example, as shown in FIG. 5, control circuit 505 may route signals through four separate paths 540. A first path 540-*a* may include a single signal line 520-*a* extending to and from control circuit 505. A second path 540-*b* may include test circuits 510-*a* and 510-*b*, and signal lines 520-*b*, 520-*c*, and 520-*d* extending to and from control circuit 505. A third path 540-*c* may include test circuits 510-*c* and 510-*d*, and signal lines 520-*e*, 520-*f*, and 520-*g* extending to and from control circuit 505. A fourth path 540-*d* may include a single signal line 520-*h* extending to and from control circuit 505. Each of these paths are examples of different configurations of a signal line. Any signal line 520 of the die may be configured using any configuration illustrated.

By using multiple paths, multiple defects in the die may be detected. In addition, any detected defect may be more precisely located. Furthermore, searching for defects can be performed concurrently along the separate paths, thereby saving time.

In some cases, each signal line 520 may include a portion that passes through the interior of die 501 and a portion that runs along (or adjacent to) the perimeter of die 501. In those cases, each signal line 520 may incorporate aspects of an internal signal line, as discussed with reference to FIG. 4, and a perimeter signal line, also as discussed with reference to FIG. 4.

In one example, the die may comprise separate regions and each path may at least partially encircle or otherwise define one of the regions. For example, paths 540-*a*, 540-*b*, 540-*c*, and 540-*d* may define four separate regions (respectively denoted 1-4) of die 501. As such, using paths 540, each region may be separately tested. A region may be any area of the die. For example, a region may be a group of memory banks (e.g., as in FIG. 5), a single memory bank, or a group of other type of circuitry. In some examples, a region may be determined based on the importance of circuitry on the die.

Control circuit 505 may be located anywhere on die 501. In some examples, control circuit 505 may be located where the regions come together. For example, control circuit may be located where regions 1-4 meet. With respect to paths including test circuits (e.g., paths 540-*b* and 540-*c*), clock, enable, and status signals may be initiated by control circuit 505 and routed along the paths from one test circuit to the next via signal lines 520, and the feedback signal may be returned to control circuit 505, as discussed with reference to FIGS. 1-4. With respect to paths having no test circuits (e.g., paths 540-*a* and 540-*d*), control circuit 505 may incorporate test circuit circuitry (e.g., circuitry discussed with reference to FIG. 3) to detect and determine defects along the single signal line 520.

In some examples, control circuit 505 may coordinate testing of some or all of the regions. In some examples, testing of some or all of the regions may happen concurrently. In some examples, control circuit 505 may include multiple logic units (e.g., test circuits) that separately control respective paths 540.

In some examples, there may be a gap in the perimeter of a die between adjacent paths. For example, a gap may exist between signal line 520-*a* of path 540-*a* and signal line 520-*h* of path 540-*d*. To avoid possibly missing defects in the gapped portion of the perimeter, portions of the adjacent paths at the perimeter may be positioned physically close together. For example, portions of signal line 520-*a* and 520-*h* may be brought closer together where the signal lines meet at the perimeter of the die, as shown in the inset of FIG. 5.

Although FIG. 5 shows four paths, any number of paths may be used. For example, two, four, eight, or sixteen paths may be used. Other numbers of paths may also be used. For each path, any number of signal lines may be used. Similarly, any number of regions may also be defined. For example, two, four, eight, or sixteen regions may be defined. Other numbers of regions may also be defined.

Figure 6:
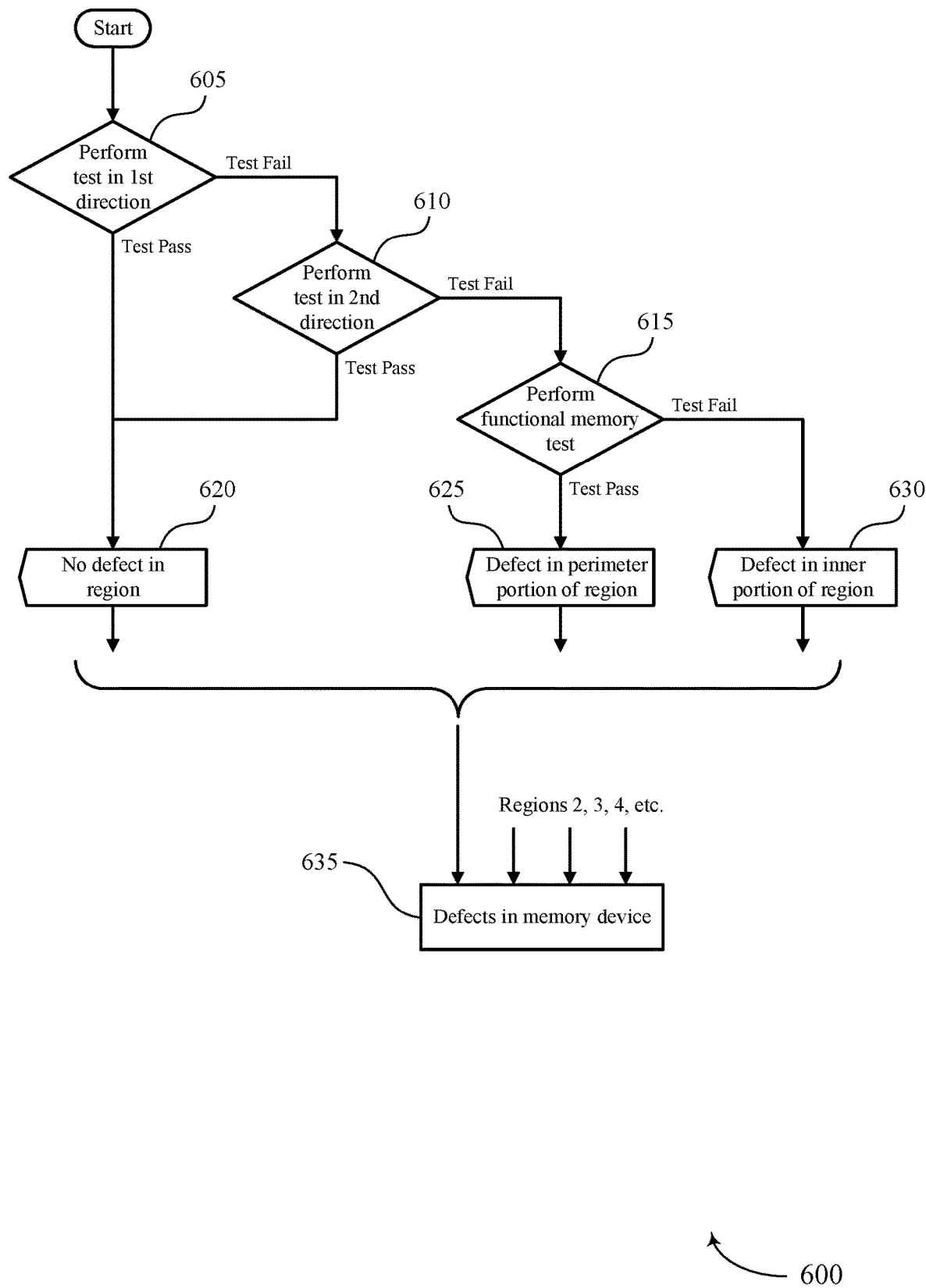
FIG. 6 shows a flowchart illustrating a method that supports defect detection for a memory device in accordance with examples as disclosed herein.

FIG. 6 shows a flowchart illustrating a method 600 that supports defect detection for a memory device in accordance with examples as disclosed herein. The operations of method 600 may be implemented by a die defect detector as described herein. For example, the operations of method 600 may be performed by a die defect detector 400 or a die defect detector 500 as described with reference to FIGS. 4-5. In some examples, a memory system may execute a set of instructions to control the functional elements of the memory device to perform the described functions. Additionally or alternatively, a memory device may perform aspects of the described functions using special-purpose hardware. Method 600 may facilitate the detection and determination of defects both along a perimeter of a die and within an inner portion of the die.

Using method 600, a defect may be detected, and the location and seriousness of the defect may be determined using various tests. In some examples, multiple locations (e.g., regions) of a die may be tested. With reference to FIG. 5, region 1 will be used as an example for this method.

At 605, a first test may be performed on the region in a first direction. For example, as discussed above, a control circuit may transmit a clock, a status, and/or an enable signal around a path in a first direction (e.g., a counterclockwise direction). Any test circuits in the path may perform their actions as the signals continue propagating in the first direction. The test circuits may transmit a feedback signal in the opposite direction (e.g., clockwise direction) back through the path to the control circuit. The control circuit may determine, based on the feedback signal, whether a defect exists on the die.

For example, clock, status, and/or enable signals may be transmitted by control circuit 505 to signal line 520-*b* on port 555 so the signals may travel in a counterclockwise direction around path 540-*b*. Test circuits 510-*a* and 510-*b*, on path 540-*b* may perform their actions and send back a feedback signal to control circuit 505, as discussed above, via port 555. The other signals may be received by control circuit 505 from signal line 520-*d* on port 550 after propagating around path 540-*b*. Based on the feedback signal, control circuit 505 may determine whether a die defect exists in the region.

If the first hardware test indicates there is likely no defect in the region (e.g., the test passes) as indicated at 620, the method may continue to 635. If the first hardware test indicates a defect may be present in the region (e.g., the test fails), the method may continue to 610.

At 610, a second test may be performed on the region in a second direction. In some cases, the second hardware test may be the same type of test performed using the same path as the first hardware test, but in the second direction. In some cases, the second direction may be opposite to the first direction. For example, the control circuit may transmit a clock, status, and/or enable signal around a path in a second direction (e.g., a clockwise direction). Any test circuits in the path may perform their actions as the signals continue propagating in the second direction. The test circuits may transmit a feedback signal in the opposite direction (e.g., counterclockwise direction) back through the path to the control circuit. The control circuit may determine, based on the feedback signal, whether a die defect exists.

For example, clock, status, and/or enable signals may be transmitted by control circuit 505 to signal line 520-*a* on port 550 so the signals may travel in a clockwise direction around signal line 520-*a*. Test circuits, if any, on signal line 520-*a* may perform their actions and send back a feedback signal to control circuit 505, as discussed above, via port 550. The other signals may be received by control circuit 505 from signal line 520-*a* on port 555. Based on the feedback signal, control circuit 505 may determine whether a defect exists in the region of the die.

If the second hardware test indicates there is likely no defect in the region (e.g., the test passes) as indicated at 620, the method may continue to 635. So in some cases, if the second hardware test passes at 610, even if the first hardware test failed at 605, there is likely no defect in the region. If the second hardware test indicates a defect may be present in the region (e.g., the test fails), then both the first hardware test and the second hardware test failed. Thus, it is likely that a defect is present in the region. To determine where the defect is in the region, the method may continue to 615.

At 615, a test operation (e.g., a functional memory test) may be performed on the memory in the region. In one case, the test operation test may include writing data (e.g., a pattern of data) to one or more memory cells of the region, then reading the one or more memory cells. The data read from the memory cells may be compared to the data written to the memory cells. If the data that was read matches the data that was written, the memory cells may be free from errors and the test may indicate that the memory passed the test operation. If the data that was read does not match the data that was written (or an expected value of the data), the memory cells may include one or more errors and the test may indicate that the memory failed the test operation. Other types of test operations can also be used.

If the test operation indicates that the memory passed, then the defect in the region is likely not affecting the memory and may therefore be on a perimeter portion of the region, as indicated at 625. When this is the case, the die may still be usable. If the test operation indicates that the memory failed, then the defect in the region is likely affecting the memory and may therefore be in an inner portion of the region, as indicated at 630. Either way, the method may continue to 635.

At 635, an overall assessment of the defects and corresponding seriousness may be determined. If 635 was entered from 605 or 610, there is likely no defect in the region. If 635 was entered from 615, there likely is a defect in the region, and depending on the outcome of 615, the defect is likely on the perimeter or on the inner portion of the region. In some examples, a die may include more than one region. At 635, the overall defects, if any, of the die may be determined based on the defects found in each region. In some examples, defects of other regions may be determined in a similar manner as that described above, using, e.g., one or more of 605, 610, and 615.

In some cases, at the completion of method 600, a message may be sent, e.g., to a host system. The message may include information about the defect or defects, such as how many were detected, where on the die they were detected, and whether memory cells were affected. In some cases, a message may be sent if a defect was detected in the die after completion of method 600.

Figure 7:
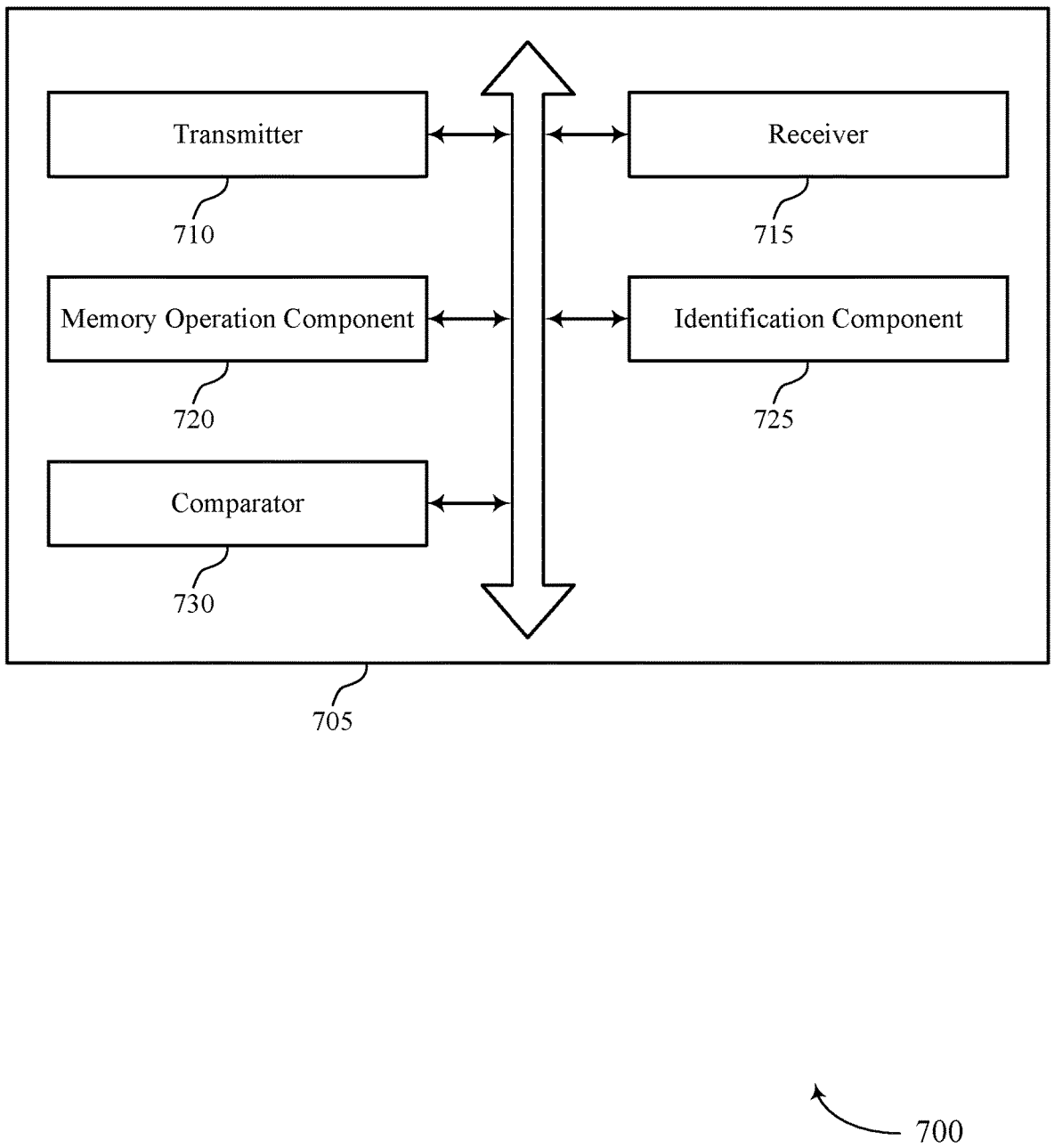
FIG. 7 shows a block diagram of a memory device that supports defect detection for a memory device in accordance with examples as disclosed herein.

FIG. 7 illustrates another example of a segmented digital die defect detector 700 that supports defect detection for a memory device in accordance with examples as disclosed herein. The memory device 705 may be an example of aspects of a memory device as described with reference to FIGS. 1-6. The memory device 705 may include a transmitter 710, a receiver 715, a memory operation component 720, an identification component 725, and a comparator 730. Each of these modules may communicate, directly or indirectly, with one another (e.g., via one or more buses).

The transmitter 710 may transmit a first clock signal over a signal line in a first direction, the signal line at least partially surrounding a region of memory cells of a die. In some examples, the transmitter 710 may transmit a second clock signal over the signal line in a second direction based on receiving the first feedback signal from the signal line. In some examples, the transmitter 710 may transmit a third clock signal over a second signal line in a third direction, the second signal line at least partially surrounding a second region of memory cells of the die. In some examples, the transmitter 710 may transmit a fourth clock signal over the second signal line in a fourth direction based on receiving the third feedback signal from the second signal line.

The receiver 715 may receive a first feedback signal from the signal line based on transmitting the first clock signal over the signal line in the first direction. In some examples, the receiver 715 may receive a second feedback signal from the signal line based on transmitting the second clock signal over the signal line in the second direction. In some examples, the receiver 715 may receive a third feedback signal from the second signal line based on transmitting the third clock signal over the second signal line in the third direction. In some examples, the receiver 715 may receive a fourth feedback signal from the second signal line based on transmitting the fourth clock signal over the second signal line in the fourth direction.

The memory operation component 720 may perform a test operation on the memory cells of the region of the die based on receiving the second feedback signal from the signal line. In some examples, the memory operation component 720 may write a pattern of data to one or more memory cells of the region. In some examples, the memory operation component 720 may read the one or more memory cells based on writing the pattern of data to the one or more memory cells. In some examples, the memory operation component 720 may write a pattern of data to one or more memory cells of the region. In some examples, the memory operation component 720 may read the one or more memory cells based on writing the pattern of data to the one or more memory cells. In some examples, the memory operation component 720 may perform a second test operation on the memory cells of the second region of the die based on receiving the fourth feedback signal from the second signal line.

The identification component 725 may identify a defect in the region of the die based on the first feedback signal, the second feedback signal, or the test operation, or any combination thereof. In some examples, the identification component 725 may determine that the defect has occurred within the region of the die based on the first feedback signal. In some examples, the identification component 725 may determine that the defect has occurred within the region of the die based on the second feedback signal. In some examples, the identification component 725 may identify a second defect in the second region of the die based on the third feedback signal, the fourth feedback signal, or performing the second test operation, or any combination thereof.

The comparator 730 may determine that the memory cells of the region include one or more errors based on reading the one or more memory cells, where identifying the defect in the region is based on determining that the memory cells of the region include the one or more errors. In some examples, the comparator 730 may compare the data read from the one or more memory cells with the pattern of data written to the one or more memory cells, where determining that the memory cells of the region include the one or more errors is based on the comparison. In some examples, the comparator 730 may determine that the memory cells of the region are free from errors based on reading the one or more memory cells.

Figure 8:
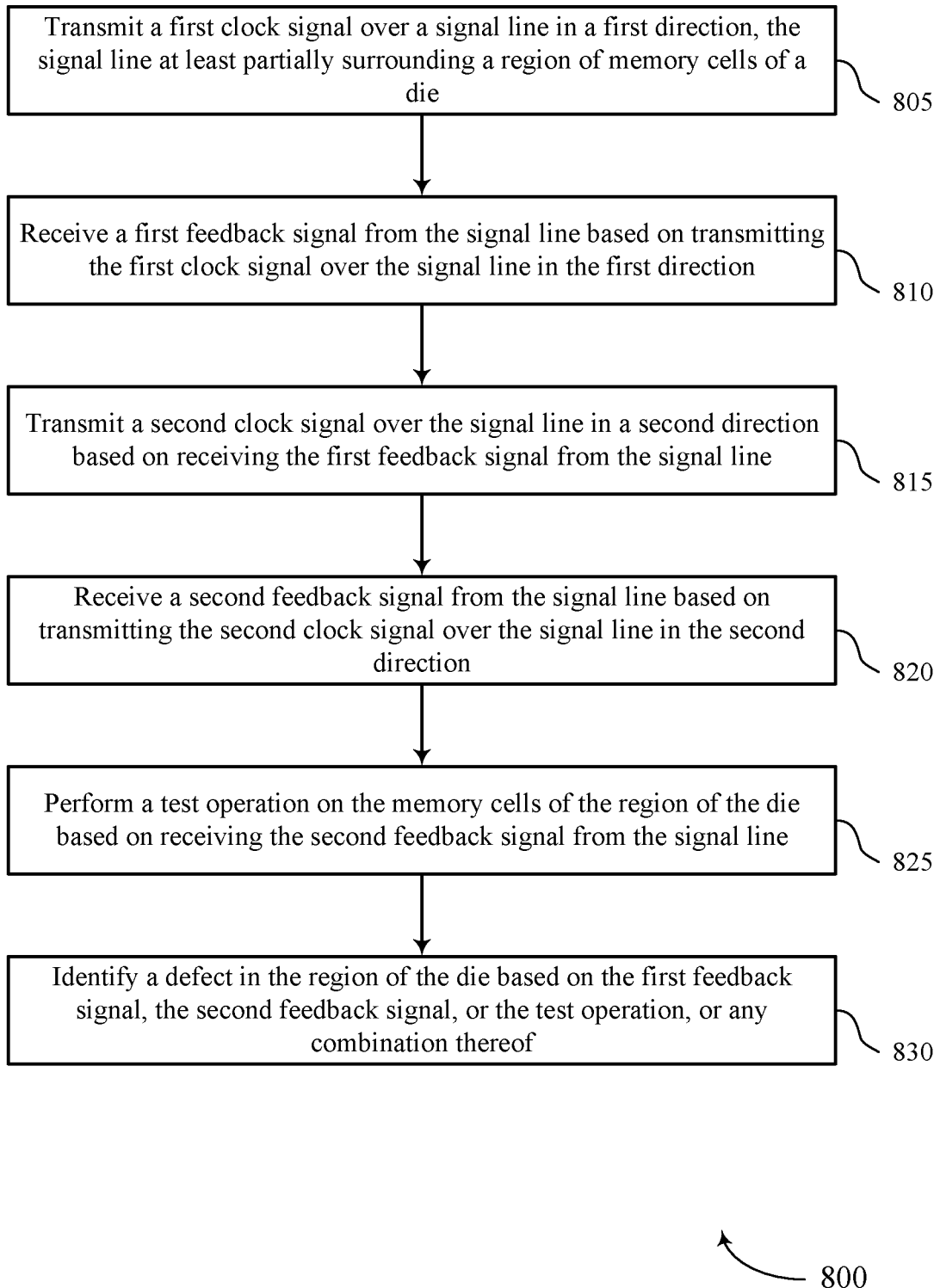
FIG. 8 shows a flowchart illustrating a method that support defect detection for a memory device in accordance with examples as disclosed herein.

FIG. 8 shows a flowchart illustrating a method 800 that supports defect detection for a memory device in accordance with examples as disclosed herein. The operations of method 800 may be implemented by a memory device or its components as described herein. For example, the operations of method 800 may be performed by a memory device as described with reference to FIGS. 1-6. In some examples, a memory device may execute a set of instructions to control the functional elements of the memory device to perform the described functions. Additionally or alternatively, a memory device may perform aspects of the described functions using special-purpose hardware.

At 805, the memory device may transmit a first clock signal over a signal line in a first direction, the signal line at least partially surrounding a region of memory cells of a die. The operations of 805 may be performed according to the methods described herein. In some examples, aspects of the operations of 805 may be performed by a transmitter as described with reference to FIG. 7.

At 810, the memory device may receive a first feedback signal from the signal line based on transmitting the first clock signal over the signal line in the first direction. The operations of 810 may be performed according to the methods described herein. In some examples, aspects of the operations of 810 may be performed by a receiver as described with reference to FIG. 7.

At 815, the memory device may transmit a second clock signal over the signal line in a second direction based on receiving the first feedback signal from the signal line. The operations of 815 may be performed according to the methods described herein. In some examples, aspects of the operations of 815 may be performed by a transmitter as described with reference to FIG. 7.

At 820, the memory device may receive a second feedback signal from the signal line based on transmitting the second clock signal over the signal line in the second direction. The operations of 820 may be performed according to the methods described herein. In some examples, aspects of the operations of 820 may be performed by a receiver as described with reference to FIG. 7.

At 825, the memory device may perform a test operation on the memory cells of the region of the die based on receiving the second feedback signal from the signal line. The operations of 825 may be performed according to the methods described herein. In some examples, aspects of the operations of 825 may be performed by a memory operation component as described with reference to FIG. 7.

At 830, the memory device may identify a defect in the region of the die based on the first feedback signal, the second feedback signal, or the test operation, or any combination thereof. The operations of 830 may be performed according to the methods described herein. In some examples, aspects of the operations of 830 may be performed by an identification component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for transmitting a first clock signal over a signal line in a first direction, the signal line at least partially surrounding a region of memory cells of a die, receiving a first feedback signal from the signal line based on transmitting the first clock signal over the signal line in the first direction, transmitting a second clock signal over the signal line in a second direction based on receiving the first feedback signal from the signal line, receiving a second feedback signal from the signal line based on transmitting the second clock signal over the signal line in the second direction, performing a test operation on the memory cells of the region of the die based on receiving the second feedback signal from the signal line, and identifying a defect in the region of the die based on the first feedback signal, the second feedback signal, or the test operation, or any combination thereof.

Some examples of the method 800 and the apparatus described herein may further include operations, features, means, or instructions for determining that the defect may have occurred within the region of the die based on the first feedback signal.

Some examples of the method 800 and the apparatus described herein may further include operations, features, means, or instructions for determining that the defect may have occurred within the region of the die based on the second feedback signal.

In some examples of the method 800 and the apparatus described herein, performing the test operation may include operations, features, means, or instructions for writing a pattern of data to one or more memory cells of the region, reading the one or more memory cells based on writing the pattern of data to the one or more memory cells, and determining that the memory cells of the region include one or more errors based on reading the one or more memory cells, where identifying the defect in the region may be based on determining that the memory cells of the region include the one or more errors.

Some examples of the method 800 and the apparatus described herein may further include operations, features, means, or instructions for comparing the data read from the one or more memory cells with the pattern of data written to the one or more memory cells, where determining that the memory cells of the region include the one or more errors may be based on the comparison.

Some examples of the method 800 and the apparatus described herein may further include operations, features, means, or instructions for writing a pattern of data to one or more memory cells of the region, reading the one or more memory cells based on writing the pattern of data to the one or more memory cells, and determining that the memory cells of the region may be free from errors based on reading the one or more memory cells.

Some examples of the method 800 and the apparatus described herein may further include operations, features, means, or instructions for transmitting a third clock signal over a second signal line in a third direction, the second signal line at least partially surrounding a second region of memory cells of the die, receiving a third feedback signal from the second signal line based on transmitting the third clock signal over the second signal line in the third direction, transmitting a fourth clock signal over the second signal line in a fourth direction based on receiving the third feedback signal from the second signal line, receiving a fourth feedback signal from the second signal line based on transmitting the fourth clock signal over the second signal line in the fourth direction, performing a second test operation on the memory cells of the second region of the die based on receiving the fourth feedback signal from the second signal line, and identifying a second defect in the second region of the die based on the third feedback signal, the fourth feedback signal, or performing the second test operation, or any combination thereof.

It should be noted that the methods described herein describe possible implementations, and that the operations and the steps may be rearranged or otherwise modified and that other implementations are possible. Further, portions from two or more of the methods may be combined.

An apparatus is described. The apparatus may include a first signal line extending through a portion of a die and separating a first memory bank from a second memory bank of the die, a second signal line including a portion that at least partially extends adjacent to a perimeter of the die, a test circuit coupled with the first signal line and the second signal line, the test circuit configured to generate a first feedback signal based on a first condition of the first signal line and a second feedback signal based on a second condition of the second signal line, and a control circuit coupled with the first signal line and the second signal line, the control circuit configured to transmit a clock signal to the test circuit and receive the first feedback signal and the second feedback signal based on transmitting the clock signal.

In some examples, the first condition of the first signal line may indicate an existence of a defect in the die or an absence of the defect in the die, and the first feedback signal may include a first state indicating the existence of the defect or a second state indicating the absence of the defect.

In some examples, the control circuit may be configured to identify a defect in the die based on the first feedback signal and the second feedback signal. In some examples, the control circuit may be configured to identify a defect in an internal portion of the die based at least in part on the first feedback signal and the control circuit is configured to identify a defect adjacent to the perimeter of the die based at least in part on the second feedback signal.

In some examples, the control circuit may be configured to identify a defect in the portion of the die that separates the first memory bank from the second memory bank based on the first feedback signal.

In some examples, the test circuit may include operations, features, means, or instructions for a first test circuit coupled with the first signal line and configured to generate the first feedback signal based on the first condition of the first signal line, and a second test circuit coupled with the second signal line and configured to generate the second feedback signal based on the second condition of the second signal line.

Some examples may further include isolating the first signal line from the second signal line based on the clock signal, and generate the first feedback signal based on isolating the first signal line from the second signal line.

In some examples, the control circuit may be configured to transmit the clock signal in a first direction over the first signal line, and the test circuit may be configured to transmit the first feedback signal in a second direction over the first signal line and different from the first direction.

In some examples, the clock signal and the first feedback signal may be transmitted concurrently.

An apparatus is described. The apparatus may include a set of signal lines including a first signal line and a second signal line, the first signal line at least partially surrounding a first set of memory cells of a die and the second signal line surrounding a second set of memory cells of the die and a control circuit coupled with the set of signal lines, the control circuit configured to transmit a clock signal over the first signal line and the second signal line and to receive, based on transmitting the clock signal, a first feedback signal based on a first condition of the first signal line and a second feedback signal based on a second condition of the second signal line.

Some examples of the apparatus may include a first region including the first set of memory cells, where the first signal line may at least partially surround the first region, and a second region including the second set of memory cells, where the second signal line may at least partially surround the second region.

In some examples, the first signal line may extend at least partially adjacent to a perimeter of the die and at least partially through a portion of the die separating the first region from the second region.

In some examples, the set of signal lines may include two, four, eight, or sixteen signal lines.

In some examples, the control circuit may be configured to transmit the clock signal in a first direction over the first signal line and to transmit the clock signal in a second direction over the first signal line.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that may include the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" used herein refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a first signal line extending through a portion of a die and separating a first memory bank from a second memory bank of the die;
   a second signal line comprising a portion that at least partially extends adjacent to a perimeter of the die;
   a test circuit coupled with the first signal line and the second signal line, the test circuit configured to generate a first feedback signal based at least in part on a first condition of the first signal line and a second feedback signal based at least in part on a second condition of the second signal line; and
   a control circuit coupled with the first signal line and the second signal line, the control circuit configured to transmit a clock signal to the test circuit and receive the first feedback signal and the second feedback signal based at least in part on transmitting the clock signal.

2. The apparatus of claim 1, wherein:
   the first condition of the first signal line indicates an existence of a defect in the die or an absence of the defect in the die; and
   the first feedback signal comprises a first state indicating the existence of the defect or a second state indicating the absence of the defect.

3. The apparatus of claim 1, wherein the control circuit is configured to identify a defect in an internal portion of the die based at least in part on the first feedback signal and the control circuit is configured to identify a defect adjacent to the perimeter of the die based at least in part on the second feedback signal.

4. The apparatus of claim 1, wherein the control circuit is configured to identify a defect in the portion of the die that separates the first memory bank from the second memory bank based at least in part on the first feedback signal.

5. The apparatus of claim 1, further comprising:
   a second test circuit coupled with the second signal line and configured to generate a third feedback signal based at least in part on the second condition of the second signal line, wherein the test circuit is configured to obtain the third feedback signal from the second test circuit and generate the second feedback signal based at least in part on the third feedback signal.

6. The apparatus of claim 5, wherein the test circuit is further configured to:
   isolate the first signal line from the second signal line based at least in part on the clock signal; and
   generate the first feedback signal based at least in part on isolating the first signal line from the second signal line.

7. The apparatus of claim 1, wherein:
   the control circuit is configured to transmit the clock signal in a first direction over the first signal line; and the test circuit is configured to transmit the first feedback signal in a second direction over the first signal line and different from the first direction.

8. The apparatus of claim 1, wherein the clock signal and the first feedback signal are transmitted concurrently.

9. An apparatus, comprising:
a plurality of signal lines comprising a first signal line and a second signal line, the first signal line at least partially surrounding a first plurality of memory cells of a die and the second signal line at least partially surrounding a second plurality of memory cells of the die;
a control circuit coupled with the plurality of signal lines, the control circuit configured to transmit a clock signal over the first signal line and the second signal line and to receive, based at least in part on transmitting the clock signal, a first feedback signal based at least in part on a first condition of the first signal line and a second feedback signal based at least in part on a second condition of the second signal line; and
one or more test circuits coupled with the plurality of signal lines, the one or more test circuits configured to generate the first feedback signal and the second feedback signal.

10. The apparatus of claim 9, further comprising:
a first region comprising the first plurality of memory cells, wherein the first signal line at least partially surrounds the first region; and
a second region comprising the second plurality of memory cells, wherein the second signal line at least partially surrounds the second region.

11. The apparatus of claim 10, wherein the first signal line extends at least partially adjacent to a perimeter of the die and at least partially through a portion of the die separating the first region from the second region.

12. The apparatus of claim 9, wherein the plurality of signal lines comprises two, four, eight, or sixteen signal lines.

13. The apparatus of claim 9, wherein the control circuit is configured to transmit the clock signal in a first direction over the first signal line and to transmit the clock signal in a second direction over the first signal line.

14. The apparatus of claim 9, wherein the one or more test circuits comprises a test circuit that is incorporated in the control circuit.

15. A method, comprising:
transmitting a first clock signal over a signal line in a first direction, the signal line at least partially surrounding a region of memory cells of a die;
receiving a first feedback signal from a test circuit over the signal line based at least in part on transmitting the first clock signal over the signal line in the first direction;
transmitting a second clock signal over the signal line in a second direction based at least in part on receiving the first feedback signal from the test circuit over the signal line;
receiving a second feedback signal from the test circuit over the signal line based at least in part on transmitting the second clock signal over the signal line in the second direction;
performing a test operation on the memory cells of the region of the die based at least in part on receiving the second feedback signal from the test circuit over the signal line; and identifying a defect in the region of the die based at least in part on the first feedback signal, the second feedback signal, or the test operation, or any combination thereof.

16. The method of claim 15, further comprising:
determining that the defect has occurred within the region of the die based at least in part on the first feedback signal.

17. The method of claim 15, further comprising:
determining that the defect has occurred within the region of the die based at least in part on the second feedback signal.

18. The method of claim 15, wherein performing the test operation comprises:
writing a pattern of data to one or more memory cells of the region;
reading the one or more memory cells based at least in part on writing the pattern of data to the one or more memory cells; and
determining that the memory cells of the region include one or more errors based at least in part on reading the one or more memory cells, wherein identifying the defect in the region is based at least in part on determining that the memory cells of the region include the one or more errors.

19. The method of claim 18, further comprising:
comparing the data read from the one or more memory cells with the pattern of data written to the one or more memory cells, wherein determining that the memory cells of the region include the one or more errors is based at least in part on the comparison.

20. The method of claim 15, further comprising:
writing a pattern of data to one or more memory cells of the region;
reading the one or more memory cells based at least in part on writing the pattern of data to the one or more memory cells; and
determining that the memory cells of the region are free from errors based at least in part on reading the one or more memory cells.

21. The method of claim 15, further comprising:
transmitting a third clock signal over a second signal line in a third direction, the second signal line at least partially surrounding a second region of memory cells of the die;
receiving a third feedback signal from a second test circuit over the second signal line based at least in part on transmitting the third clock signal over the second signal line in the third direction;
transmitting a fourth clock signal over the second signal line in a fourth direction based at least in part on receiving the third feedback signal from the second test circuit over the second signal line;
receiving a fourth feedback signal from the second test circuit over the second signal line based at least in part on transmitting the fourth clock signal over the second signal line in the fourth direction;
performing a second test operation on the memory cells of the second region of the die based at least in part on receiving the fourth feedback signal from the second test circuit over the second signal line; and
identifying a second defect in the second region of the die based at least in part on the third feedback signal, the fourth feedback signal, or performing the second test operation, or any combination thereof.

22. The method of claim 15, wherein the test circuit is incorporated in a control circuit coupled with the signal line.

23. The method of claim 15, wherein the test circuit is one of a plurality of test circuits coupled with the signal line.

24. The method of claim 21, wherein the test circuit and the second test circuit are incorporated in a control circuit that is coupled with the signal line and the second signal line.

\* \* \* \* \*